United States Patent
Umeda et al.

(10) Patent No.: US 8,343,800 B2
(45) Date of Patent: Jan. 1, 2013

(54) THIN FILM TRANSISTOR AND METHOD OF PRODUCING THIN FILM TRANSISTOR

(75) Inventors: Kenichi Umeda, Kanagawa (JP); Masayuki Suzuki, Kanagawa (JP); Atsushi Tanaka, Kanagawa (JP); Yuki Nara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 336 days.

(21) Appl. No.: 12/815,430

(22) Filed: Jun. 15, 2010

(65) Prior Publication Data
US 2010/0320459 A1    Dec. 23, 2010

(30) Foreign Application Priority Data
Jun. 22, 2009    (JP) .................. 2009-147932

(51) Int. Cl.
*H01L 21/00*    (2006.01)
*H01L 21/16*    (2006.01)
*H01L 29/12*    (2006.01)

(52) U.S. Cl. .................. 438/104; 257/43; 257/E29.079; 257/E29.296

(58) Field of Classification Search .................. 438/796, 438/104; 257/E29.079, E21.328, 43, E21.459, 257/E29.296
See application file for complete search history.

(56) References Cited

U.S. PATENT DOCUMENTS
2011/0121346 A1*    5/2011    Yamada et al. .................. 257/98

FOREIGN PATENT DOCUMENTS
JP    3947575 B    7/2007

OTHER PUBLICATIONS
Nature, 432 (2004) pp. 488-492.
Journal of the American Ceramic Society, 82 (1999) pp. 2705-2710.

\* cited by examiner

*Primary Examiner* — David S Blum
(74) *Attorney, Agent, or Firm* — SOLARIS Intellectual Property Group, PLLC

(57) ABSTRACT

The invention provides a thin film transistor comprising an active layer, the active layer comprising an IGZO-based oxide material, the IGZO-based oxide material being represented by a composition formula of $In_{2-x}Ga_xZnO_{4-\delta}$, where $0.75<x<1.10$ and $0<\delta\leq 1.29161\times\exp(-x/0.11802)+0.00153$ and being formed from a single phase of IGZO having a crystal structure of $YbFe_2O_4$, and a method of producing the thin film transistor.

9 Claims, 17 Drawing Sheets

THIN FILM TRANSISTOR AND METHOD OF PRODUCING THIN FILM TRANSISTOR

CROSS-REFERENCE TO RELATED APPLICATION

This application claims priority under 35 USC 119 from Japanese Patent Application No. 2009-147932, filed on Jun. 22, 2009, the disclosure of which is incorporated by reference herein.

BACKGROUND OF THE INVENTION

1. Field of the Invention

The invention relates to a thin film transistor and a method of producing a thin film transistor.

2. Description of the Related Art

In recent years, amorphous In—Ga—Zn—O-based homologous oxide materials (hereinafter, referred to as "IGZO-based oxide materials" or simply as "IGZO" sometimes), represented by a composition formula $In_{2-x}Ga_xO_3(ZnO)_m$ ($0<x<2$ and m is a natural number) in a crystalline state thereof, have been attracting attention.

Hosono et al. from the Tokyo Institute of Technology reports that amorphous IGZO-based oxide materials exhibit a value of electrical resistivity similar to that of a semiconductor and can be formed into a film at room temperature, and that these materials can achieve a mobility that is equal to or higher than that of amorphous silicon (Hosono et al., Non-patent Document 1, Nature, 432 (2004), pp. 488-492).

In particular, amorphous IGZO-based oxide materials represented by the above composition formula in which m=1 are highly promising material systems because of the large ratio of overlapping of electron orbits between In—In, which is considered to contribute to the conduction of electrons.

Research and development on amorphous IGZO-based oxide materials is being intensely conducted with respect to the use of these materials as, for example, an effective material for an active layer of a thin film transistor (hereinafter, also referred to as a "TFT").

On the other hand, IGZO-based oxide materials having a crystalline structure are described, for example, in the following literature.

Non-patent Document 2 (Journal of the American Ceramic Society, 82 (1999), pp. 2705-2710) describes a method of producing a crystalline IGZO-based oxide material in which m=1, in which a mixture of raw materials including In, Ga and Zn is annealed at 1350° C. or higher, and then rapidly cooled down from this extremely high annealing temperature. The document also discloses that the solid solution range of Ga (range of x) is from 0.66 to 1.06.

Further, Japanese Patent No. 3947575 discloses a process of subjecting a crystalline IGZO-based oxide material in which m=1, which is obtained by annealing at certain conditions, to a reduction heat treatment at a certain temperature in a hydrogen or argon atmosphere.

In this regard, in many electron-conductive oxide materials including IGZO, properties that are unique to these materials are significantly affected by the value of the oxygen deficit amount δ. When the value of δ is great, a large number of carriers (electrons) are generated and a "degenerate semiconductor", having a Fermi level within the conductive band, is formed. In other words, the oxide material in this state is a conductor that exhibits metallic conductivity. On the other hand, when the value of δ is small, generation of carriers can be suppressed and the oxide material can exist as a semiconductor. The above fact indicates that the nature of an oxide material may greatly vary between a conductor and a semiconductor, depending on the value of the oxide deficit amount δ.

In the method described in Non-patent Document 2, the purpose of rapid cooling from a high-temperature range (quenching) is to obtain an oxide material that also maintains its state achieved at high temperature at room temperature. Generally, oxygen bound to an oxide material escapes more easily at a higher temperature, from the viewpoint of chemical equilibrium, whereby the value of δ is increased. Accordingly, an IGZO-based oxide material having a greater value of δ may be obtained as a result of performing quenching, and an IGZO-based oxide material having a greater value of δ cannot suppress the generation of carriers and behaves as a degenerate semiconductor, i.e., a metal (conductor).

On the other hand, in the method described in Japanese Patent No. 3947575, the reduction heat treatment is performed in order to introduce oxygen deficits into an oxide material. Therefore, the IGZO-based oxide material obtained by this method has a great value of δ, thereby increasing the carrier concentration thereof. As a result, the IGZO-based oxide material obtained by this method behaves as a degenerate semiconductor, i.e., a metal (conductor).

As described above, both Non-patent Document 2 and Japanese Patent No. 3947575 indicate that a crystalline IGZO-based oxide material in which m=1 is a conductor, rather than a semiconductor. Therefore, if an IGZO-based oxide material in which m=1 can be obtained as a semiconductor, this material can be widely used in electronic devices, such as as an active layer of a TFT.

Further, if the amount of Ga in an IGZO-based oxide material in which m=1 is not appropriate, this material does not form a single phase of IGZO but includes multiple crystal phases therein. Therefore, electron scattering tends to occur at grain boundaries or the like from a microscopic viewpoint. Accordingly, in order to apply a crystalline IGZO-based oxide material in which m=1 to electronic devices, an IGZO-based oxide material in which the amount of Ga is within the solid-solution range and a single phase of IGZO is formed, as described in Non-patent Document 2, is desired in view of maintaining the mobility of carriers (electrons).

SUMMARY OF THE INVENTION

The present invention has been made in view of the above circumstances and provides a thin film transistor and a method of producing a thin film transistor.

A first aspect of the invention provides a thin film transistor having an active layer, the active layer including an IGZO-based oxide material, the IGZO-based oxide material being represented by a composition formula of $In_{2-x}Ga_xZnO_{4-\delta}$, where $0.75<x<1.10$ and $0<\delta \leq 1.29161 \times \exp(-x/0.11802)+0.00153$, and being formed from a single phase of IGZO having a $YbFe_2O_4$ form crystal structure.

A second aspect of the present invention provides a method of producing the thin film transistor according to the first aspect of the present invention, wherein the active layer is produced by a process including cooling a thin film material that includes In, Ga and Zn, the thin film material having been formed on a substrate and heated to a crystallization temperature of the thin film material, from the crystallization temperature to 300° C. at an average rate of temperature decrease of from 50° C./hr to 500° C./hr.

BRIEF DESCRIPTION OF THE DRAWINGS

Exemplary embodiments of the present invention will be described in detail based on the following figures, wherein.

DETAILED DESCRIPTION OF THE INVENTION

First Exemplary Embodiment

Figure 1:
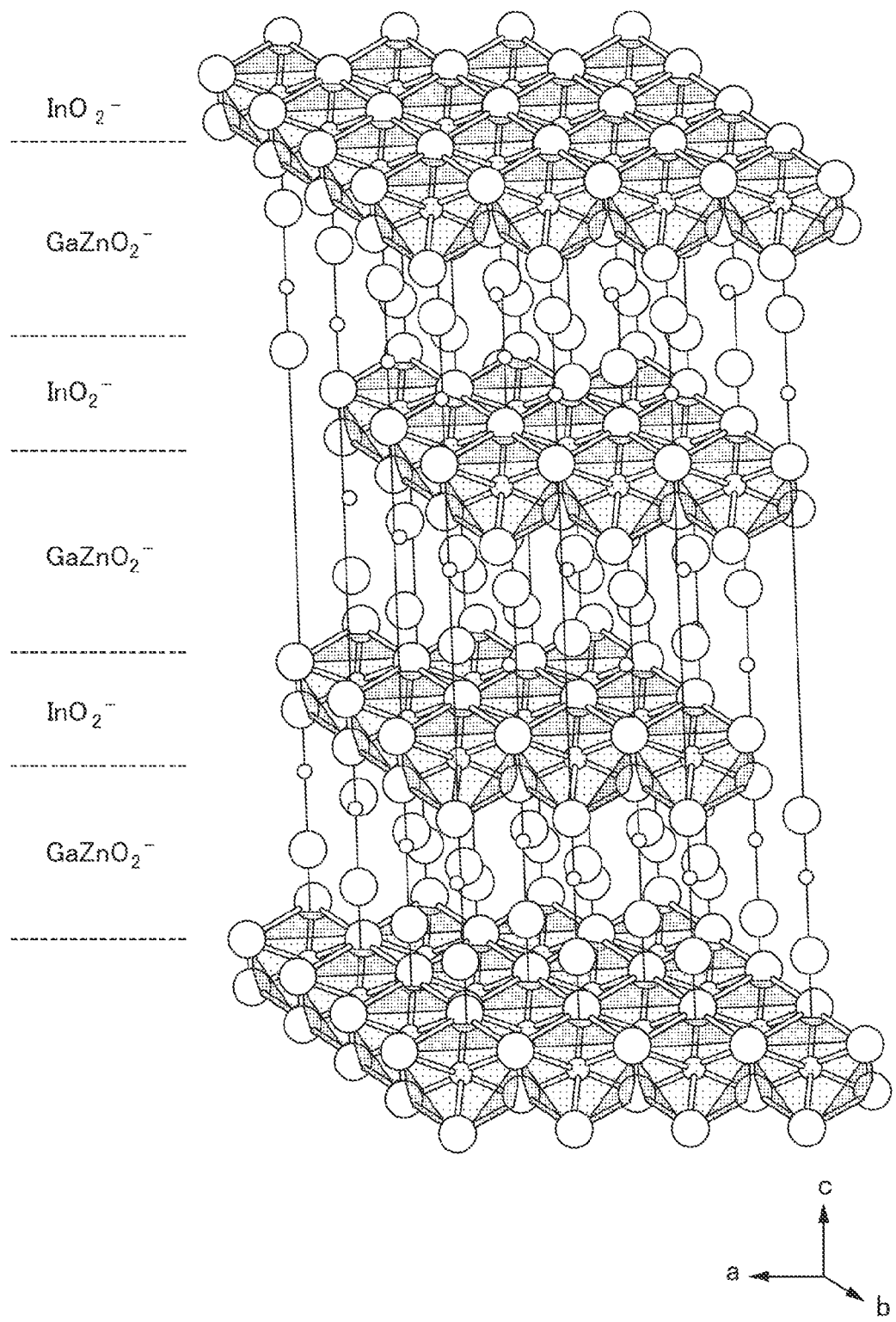
FIG. 1 shows the crystal structure of an IGZO-based oxide material according to a first exemplary embodiment of the invention.

In the first exemplary embodiment, the IGZO-based oxide material, which is used as a constituent material for the active layer of the TFT according to the invention, is described with reference to the drawings. In the drawings, components having the substantially same function as that of the components that have been previously explained are shown with the same symbol, and explanation thereof may be omitted sometimes. Details of the TFT according to the exemplary embodiment of the invention and the method of producing the same are described in the following section of the second exemplary embodiment.

(Details of IGZO-Based Oxide Material)

First, details of the IGZO-based oxide material are described.

The IGZO-based oxide material according to the first exemplary embodiment of the invention has a crystal IGZO phase represented by a composition formula of $In_{2-x}Ga_xO_3(ZnO)_m$ in which m=1. Specifically, in consideration of oxygen deficit, the material is formed from an IGZO phase represented by a composition formula of $In_{2-x}Ga_xZnO_{4-\delta}$.

FIG. 1 shows a crystal structure of the IGZO-based oxide material according to the first exemplary embodiment.

The IGZO phase that forms the IGZO-based oxide material may be single-crystalline or polycrystalline, and has a crystal structure of $YbFe_2O_4$ as shown in FIG. 1. The crystal structure shown in FIG. 1 is drawn by using a software (trade name: VESTA) based on a JCPDS card of $InGaO_3(ZnO)$ (No. 38-1104).

Further, the IGZO-based oxide material is formed from a single phase of IGZO, as mentioned above. In the present specification, the term "single phase" refers to the case in which all peaks are derived from the IGZO phase when the peaks are confirmed from the result of measurement carried out by using a powder X-ray diffraction measurement device (RINT-ULTIMA III, trade name, manufactured by Rigaku Corporation), and no peak derived from impurities is observed. Accordingly, even if an IGZO-based oxide material contains a small amount of impurities that cannot be determined by powder X-ray diffraction measurement, this material may be considered to be formed from a single phase of IGZO.

As shown above, when an IGZO-based oxide material is formed from a single phase of IGZO, occurrence of electron scattering at grain boundaries or the like can be suppressed, and the mobility of carriers (electrons) can be maintained, as compared with the case in which multiple crystalline phases exist in combination. Therefore, this material can be effectively applied to an active layer of a TFT or the like.

The value of resistivity of an IGZO-based oxide material is in the range of from $1\times10^2\Omega\cdot cm$ to $1\times10^9\Omega\cdot cm$ when measured by a resistivity measurement device (AC Hall measurement device, RESITEST 8300, trade name, manufactured by Toyo Corporation), which falls within a range of the value of resistivity that is typically suitable for an active layer of a TFT, and this range indicates that the material is a semiconductor.

When an IGZO-based oxide material is used for an active layer of a TFT, the value of resistivity thereof is preferably in the range of from $1\times10^4\Omega\cdot cm$ to $1\times10^5\Omega\cdot cm$, since the Vgs-Id curve rises at around 0 V.

In the composition formula $In_{2-x}Ga_xZnO_{4-\delta}$, the range of x is $0.75<x<1.10$, preferably $0.80\leq x\leq 1.05$ in view of reliability. This range of x represents the solid-solution range of Ga. When the amount of Ga in an IGZO-based oxide material is outside this solid-solution range, the IGZO-based oxide material is not formed only from an IGZO phase (single phase), but is in a mixed state of an IGZO phase with an impurity phase of $In_2O_3$, $ZnGa_2O_4$ or the like.

In the composition formula $In_{2-x}Ga_xZnO_{4-\delta}$, the range of oxygen deficit amount $\delta$ is $0<\delta\leq 1.29161\times\exp(-x/0.11802)+0.00153$, preferably $0.0002>\delta\leq 1.29161\times\exp(-x/0.11802)+0.00153$. The term "exp" refers to an exponential function where the base is e.

However, it is generally difficult to precisely determine the absolute value or the range of oxygen deficit amount of an oxide such as IGZO, since a high degree of measurement accuracy is required and it is not easy to differentiate from moisture, impurities or the like. Therefore, $\delta$ may be satisfied with a value at which the value of resistivity of an IGZO-based oxide material is within a range of from $1\times10^2\Omega\cdot cm$ to $1\times10^9\Omega\cdot cm$.

The upper limit of oxygen deficit amount $\delta$ ($\delta$ max) is the value of oxygen deficit amount at which the value of resistivity of $In_{2-x}Ga_xZnO_{4-\delta}$ is $1\times10^2\Omega\cdot cm$ or higher, which is calculated from the result of thermogravimetric analysis and the results of measuring the resistivity and the Hall measurement. Details of the calculation method are described later.

The reason why the lower limit of oxygen deficit amount $\delta$ is higher than 0 is that when $\delta=0$, the IGZO-based oxide material is presumed to be an insulator since carriers (electrons) are not generated.

In this regard, for example, Japanese Patent No. 3644647 describes that conductivity can be imparted to an IGZO-based oxide material by performing element substitution, even if the oxygen deficit amount is zero. It is true that a dope effect can be achieved by element substitution, but in most cases carriers are generated by substituting an element with another element having a different valency, and in principle, carriers are not generated by substituting an element with another element having the same valency. If it is desired to effectively conduct electron doping while the oxygen deficit amount being zero, the doping is conducted by substituting an element with another element having a different valency, for example, substituting a trivalent site of In or Ga with a tetravalent element or substituting a divalent site of Zn with a trivalent element.

(Method of Producing IGZO-Based Oxide Material)

In the following, the method of producing the IGZO-based oxide material is described. Exemplary methods of producing the IGZO-based oxide material according to the first exemplary embodiment of the invention include a method of producing powder, such as a solid-phase reaction method, a sol-gel method, an oxalate method, an alkoxide method or a coprecipitation method; a method of producing a single crystal, such as a flux method, a zone melting method, a CZ method or a glass annealing method via a glass precursor; and a method of producing a thin film, such as a sputtering method, a laser abrasion method, a chemical vapor deposition (CVD) method or a metal organic decomposition (MOD) method. In the following, details of the solid-phase reaction method are described.

1. Preparation of Raw Materials

First, a compound including In, a compound including Ga and a compound including Zn are prepared as the raw materials for the IGZO-based oxide material according to the first exemplary embodiment of the invention.

Examples of the compound including In include $In_2O_3$, $In(NO_3)_3$, $In(NO_3)_3 \cdot nH_2O$, $In(CH_3COO)_3$, $In(CH_3COO)_2(OH)$, $In_2O_3 \cdot nH_2O$, $InN$, $In(OH)_3$, $InO(OH)$, $In_2(C_2O_4)_3$, $In_2(C_2O_4)_3 \cdot 4H_2O$, $In(C_2H_5OCS_2)_3$ and $In_2(SO_4)_3 \cdot nH_2O$.

Examples of the compound including Ga include, similarly to the compound including In, $Ga_2O_3$, $Ga(NO_3)_3$, $Ga(NO_3)_3 \cdot nH_2O$, $Ga(CH_3COO)_3$, $Ga(CH_3COO)_2(OH)$, $Ga_2O_3 \cdot nH_2O$, $GaN$, $Ga(OH)_3$, $GaO(OH)$, $Ga_2(C_2O_4)_3$, $Ga_2(C_2O_4)_3 \cdot 4H_2O$, $Ga(C_2H_5OCS_2)_3$ and $Ga_2(SO_4)_3 \cdot nH_2O$.

Examples of the compound including Zn include $ZnO$, $Zn(C_2H_3O_2)_2$, $Zn(C_2H_3O_2)_2 \cdot 2H_2O$, $ZnBr_2$, $ZnCO_3$, $ZnS$, $ZnCl_2$, $ZnF_2$, $ZnF_2 \cdot 4H_2O$, $Zn(OH)_2$, $ZnI_2$, $Zn(NO_3)_2 \cdot 6H_2O$, $ZnC_2O_4$, $Zn(CN)_2$, $Zn(OCH_3)_2$, $Zn(OC_2H_5)_2$ and $ZnSO_4$.

2. Measurement and Mixing of Raw Materials

The raw materials as prepared above are measured using an electronic balance so that the finally obtained IGZO-based oxide material has a desired composition ratio of the raw materials. Then, the raw materials are uniformly mixed using a ceramic pot mill, or a mortar and a pestle, thereby obtaining a mixed material including In, Ga and Zn.

3. Drying and Shaping of Mixed Material

The mixed material including In, Ga and Zn is appropriately dried, and shaped. These processes of drying and shaping can be skipped.

4. Pre-Annealing and Main-Annealing of Mixed Material

Subsequently, the mixed material including In, Ga and Zn is subjected to pre-annealing. The pre-annealing is conducted in order to promote the reaction by maintaining the activity of particles in the unreacted phase by treating the mixed material at a temperature immediately under the temperature at which the desired crystal phase is obtained as a single phase. Another reason of conducing the pre-annealing is to remove carbon that is included in the mixed material in a small amount. The pre-annealing may be conducted, for example, at a maximum annealing temperature (Tmax) of from 400° C. to 1200° C., a time for maintaining Tmax of from 1 hour to 24 hours, an average rate of temperature increase of from 100° C. to 1000° C./hr (hr represents hour), and an average rate of temperature decrease of from 50° C./hr to 1000° C./hr. However, the conditions for the pre-annealing are not particularly limited thereto.

Thereafter, the mixed material that has been subjected to pre-annealing is preferably subjected to main-annealing under the conditions that include all of the following (A) to (D).

(A) The annealing atmosphere for the main-annealing is an atmosphere containing oxygen in order to allow the sintered body to absorb oxygen, during the step of temperature decrease. The oxygen concentration in the atmosphere is preferably 10% or higher in view of starting the intake of oxygen, and the oxygen concentration is more preferably equal to or higher than that of the air (approximately 21% or higher) in view of further promoting the intake of oxygen.

(B) The time for maintaining the maximum annealing temperature Tmax (details thereof are described later) is, for example, from 0.5 hours to 24 hours in view of sufficiently causing the solid-phase reaction of the raw materials, improving productivity, or the like.

(C) The average rate of temperature decrease from Tmax to 300° C. is from 50° C./hr to 500° C./hr. This rate is typically referred to as "slowly-cooling".

The reason why the average rate of temperature decrease is 50° C./hr or higher is to suppress the reduction of oxygen deficit amount $\delta$ down to 0 in the sintered body $In_{2-x}Ga_xZnO_{4-\delta}$ obtained after the main-annealing, as a result of excessive absorption of oxygen during the temperature decrease, thereby suppressing the formation of an insulator from the sintered body.

The reason why the average rate of temperature decrease is 500° C./hr or lower is to suppress the increase of oxygen deficit amount $\delta$ in the sintered body $In_{2-x}Ga_xZnO_{4-\delta}$ obtained after the main-annealing, as a result of excessively suppressing the absorption of oxygen during the temperature decrease at a rate of higher than 500° C./hr that is typically referred to as "quenching", thereby maintaining the sintered body to be a semiconductor.

In order to control the value of $\delta$ to be within a more suitable range, the average rate of temperature decrease is preferably from 100° C./hr to 200° C./hr.

The reason why the lower limit of temperature decrease is 300° C. is to prevent the oxygen deficit amount $\delta$ from being significantly changed.

In this regard, the oxygen deficit amount $\delta$ may change depending on the conditions of annealing atmosphere even if the lower limit of temperature decrease is lower than 300° C., such as 100° C. Therefore, the lower limit of temperature decrease is preferably 100° C., more preferably room temperature (25° C.).

(D) The maximum annealing temperature Tmax is not particularly limited as long as the sintered body obtained after the main-annealing forms a single phase of IGZO, and may change depending on the type or the particle size of the raw materials. For example, when $In_2O_3$, $Ga_2O_3$ and ZnO are used as the starting materials, the maximum annealing temperature Tmax is in the range of from 1200° C. to 1400° C., more preferably from 1350° C. to 1400° C.

The range of the maximum annealing temperature Tmax as mentioned in (D) is based on the following experimental results.

An IGZO-based oxide represented by $In_{2-x}Ga_xZnO_{4-\delta}$ in which x=1, i.e., $InGaZnO_{4-\delta}$, was prepared by mixing oxide powders of $In_2O_3$, $Ga_2O_3$ and ZnO at a desired molar ratio, shaping the mixed material, and annealing the same. The annealing was conducted in the air under the conditions in which the temperature was increased at a rate of 500° C./hr to a desired temperature (1000° C., 1100° C., 1200° C., 1300° C., 1350° C., 1400° C. or 1450° C.), which was maintained for 2 hours, and then the temperature was slowly decreased to room temperature.

The samples annealed at respective annealing temperatures as described above were subjected to powder X-ray diffraction measurement using a powder X-ray diffraction measurement device (RINT-ULTIMA III, trade name, manufactured by Rigaku Corporation). The results of the measurement are shown in FIG. 2 and Table 1.

TABLE 1

| Maximum Annealing Temperature Tmax | Precipitated Crystal Phase | JCPDS-No |
|---|---|---|
| Tmax ≧ 1450° C. | $InGaZnO_4$ | 38-1104 |
|  | $InGa_2O_4$ | 38-1240 |
|  | $In_2Ga_2ZnO_7$ | 38-1097 |
| 1200° C. ≦ Tmax ≦ 1400° C. | $InGaZnO_4$ | 38-1104 |
| 1100° C. ≦ Tmax < 1200° C. | $InGaZnO_4$ | 38-1104 |
|  | $In_2O_3$ | 06-0416 |
|  | $ZnGa_2O_4$ | 38-1240 |
|  | $InGaZn_2O_5$ | 40-0252 |
| Tmax ≦ 1000° C. | $In_2O_3$ | 06-0416 |
|  | $ZnGa_2O_4$ | 38-1240 |
|  | $InGaZn_2O_5$ | 40-0252 |

Figure 2:
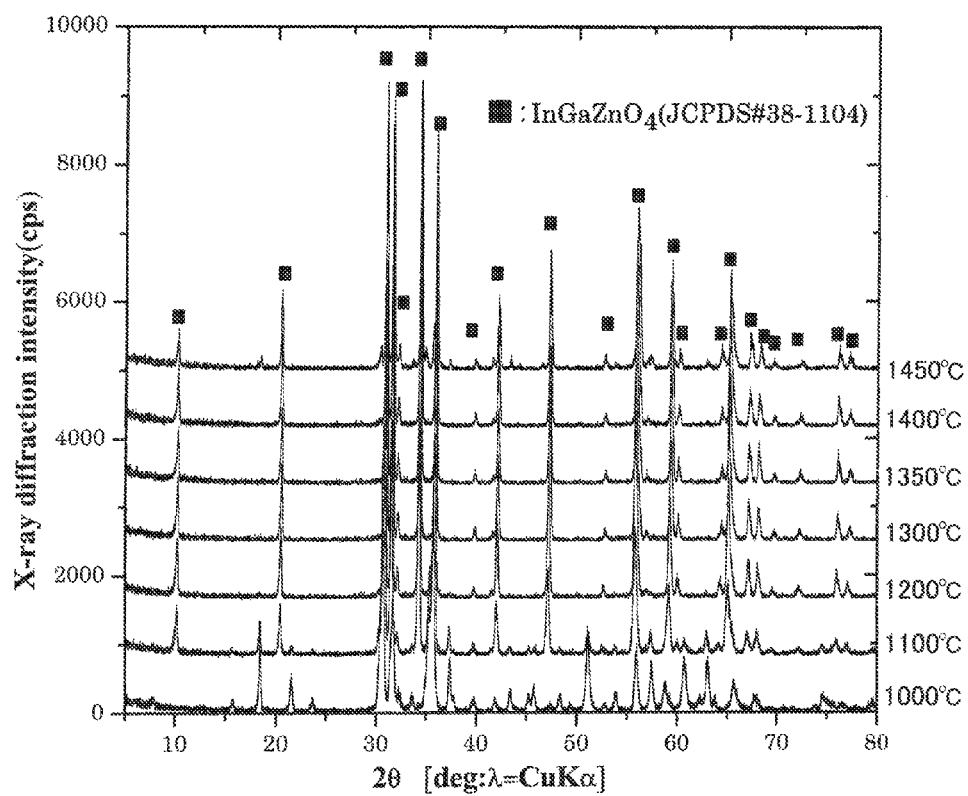
FIG. 2 shows the X-ray diffraction patterns of the samples obtained at different maximum annealing temperatures.

From the results as shown in FIG. 2 and Table 1, it was confirmed that the reaction did not sufficiently proceed at 1000° C. or lower and an IGZO phase was not obtained, while an IGZO phase was precipitated at 1100° C. or higher. It was also confirmed that an IGZO phase existed as a single phase when the annealing was conducted at 1200° C. Moreover, it was confirmed that the IGZO phase started to decompose when the annealing was conducted at an even higher temperature of 1450° C. or higher.

In view of the above results, in order to obtain a single phase of IGZO in a solid-phase reaction method in which the temperature decrease is carried out in a manner of "slowly cooling" as described in (C), the maximum annealing temperature Tmax during the main-annealing is preferably within the range of from 1200° C. to 1400° C., as mentioned above. This is because precipitation of impurities can be suppressed when the annealing is conducted at a maximum annealing temperature Tmax within this range.

Figure 3:
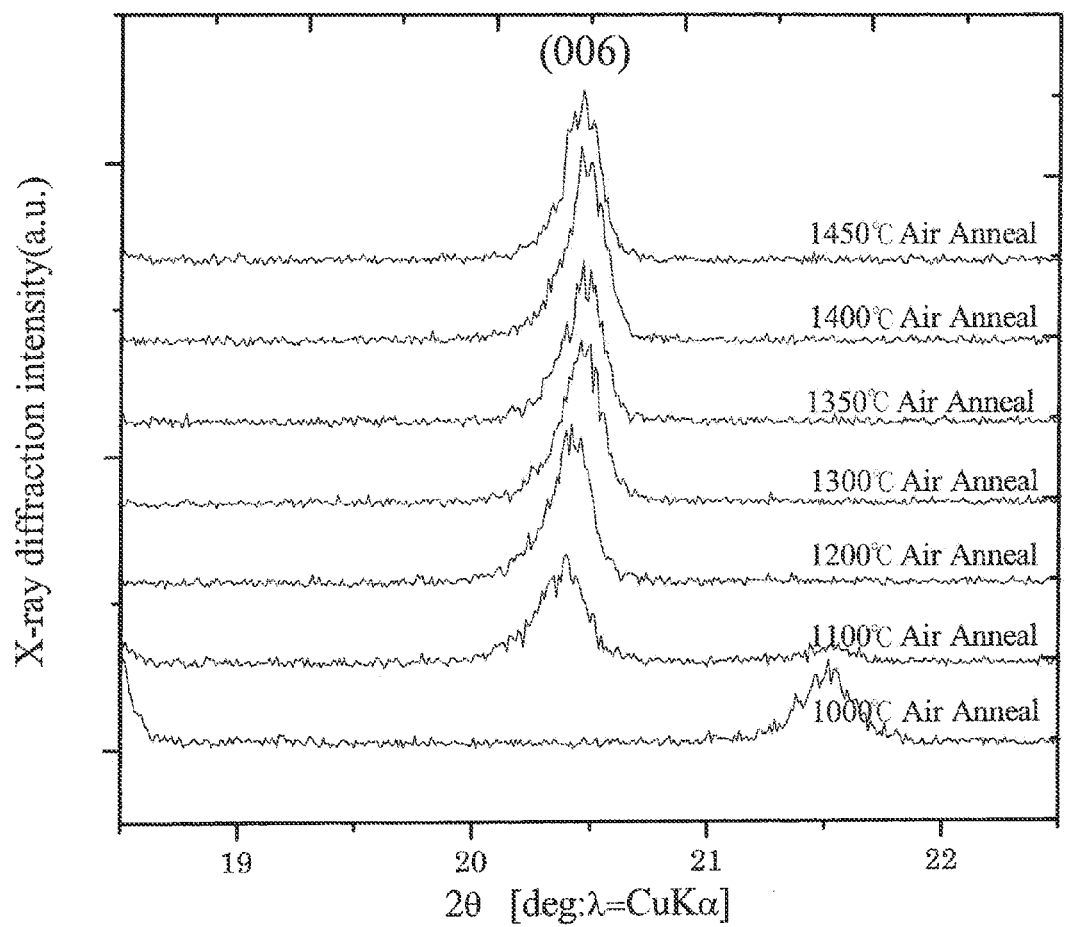
FIG. 3 shows an enlarged view of the X-ray diffraction patterns described in FIG. 2.
Figure 4:
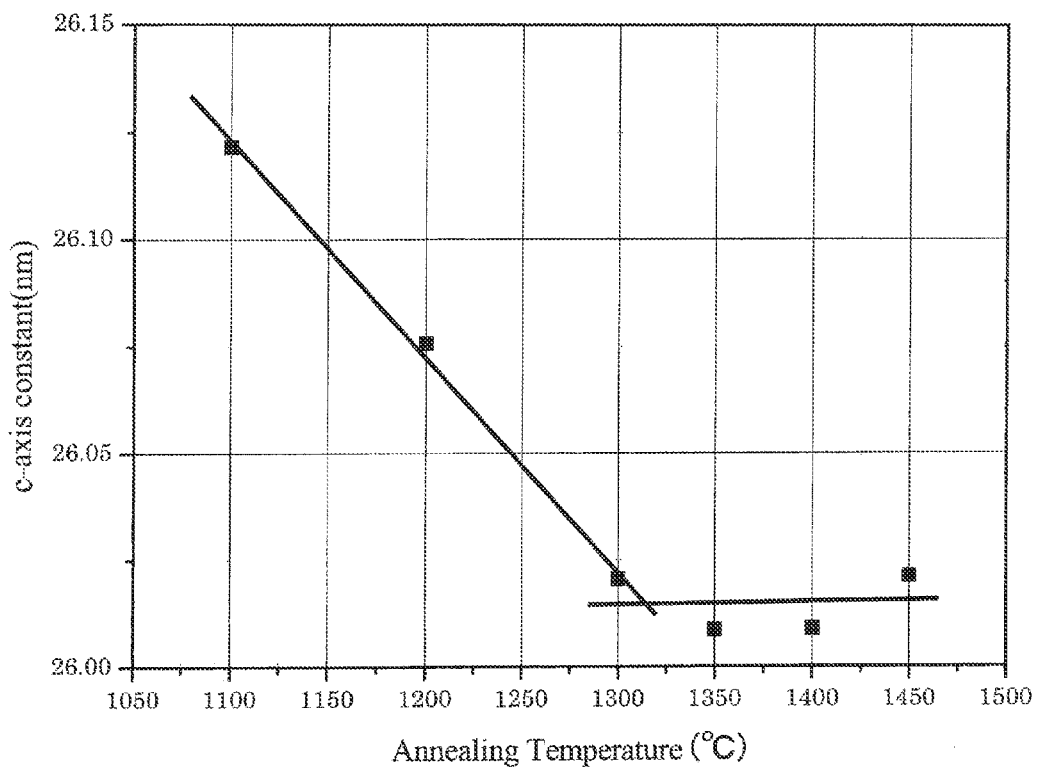
FIG. 4 shows the c-axis lattice constants of the samples obtained at different maximum annealing temperatures.

Further, it was proved that the c-axis lattice constant calculated from the peak (006) in the X-ray diffraction pattern of the IGZO single phase region at from 1200° C. to 1400° C. was decreased as the annealing temperature was increased up to 1350° C., while the c-axis lattice constant was constant at 1350° C. or higher (see FIGS. 3 and 4). This shows that the crystal of IGZO phase exists in a stable manner at 1350° C. or higher.

As a result, it was proved that the Tmax in the main-annealing was more preferably from 1350° C. to 1400° C. when the temperature was decreased in a manner of "slowly cooling" as described in (C) in a solid-phase reaction method.

By subjecting the pre-annealed material to main-annealing under the conditions that satisfy all of the aforementioned (A) to (D), the IGZO-based oxide material according to the first exemplary embodiment of the invention can be produced.

Second Exemplary Embodiment

In the following, the method of producing the (field-effect) TFT and the method of producing the same according to the second exemplary embodiment of the invention are described with reference to the drawings.

The TFT according to the second exemplary embodiment of the invention is an active device at least including a gate electrode, a gate insulating layer, an active layer, a source electrode and a drain electrode, and having a function of controlling an electric current that runs into the active layer by applying a voltage to the gate electrode, thereby switching the electric current that runs between the source electrode and the drain electrode.

The device structure of TFT may be inversely-staggered (also referred to as bottom-gate) or staggered (also referred to as top-gate), based on the position of gate electrode. Further, the TFT may have a top-contact structure or a bottom-contact structure, based on the position of a portion at which the active layer contacts the source electrode and the drain electrode (also referred to as "source/drain electrodes" sometimes).

In the top-gate structure, the gate electrode is positioned over the gate insulating layer and the active layer is formed under the gate insulating layer. In the bottom-gate structure, the gate electrode is positioned under the gate insulating layer and the active layer is formed over the gate insulating layer. Further, in the bottom-contact structure, the source/drain electrodes are formed prior to forming the active layer so that the bottom surface of the active layer contacts the source/drain electrodes, while in the top-contact structure, the active layer is formed prior to forming the source/drain electrodes so that the upper surface of the active layer contacts the source/drain electrodes.

In the following, the TFT and the method of producing the same according to the second exemplary embodiment of the invention are described by taking a TFT having a top-gate and top-contact structure as an example.

Figure 15:
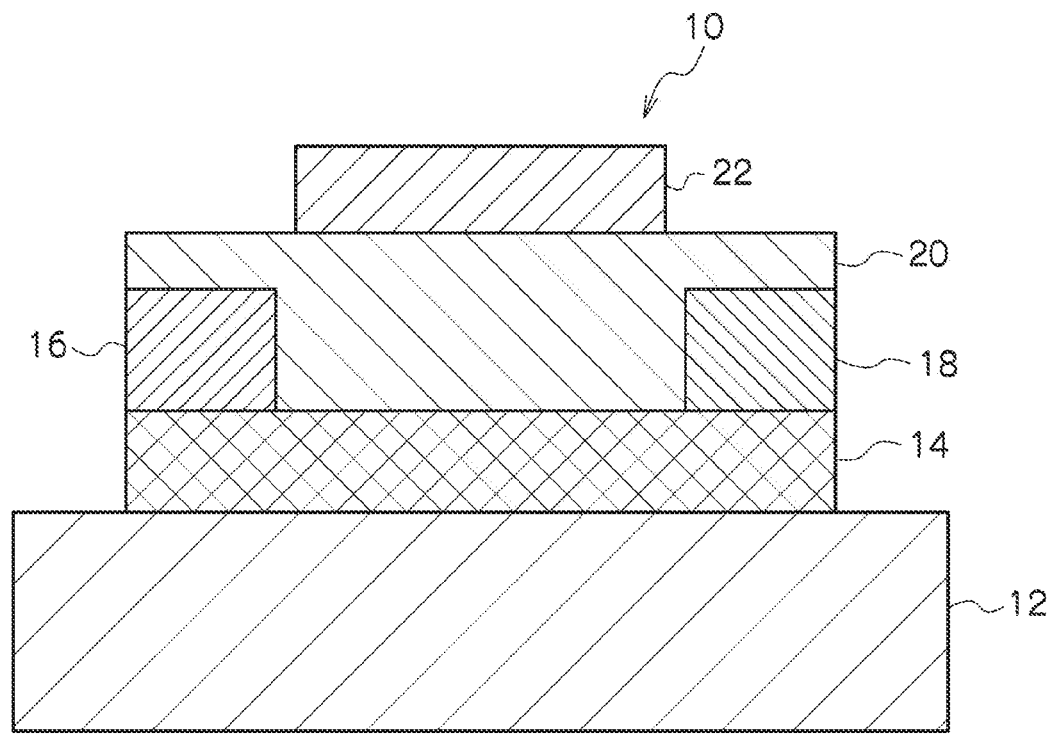
FIG. 15 is a schematic view of an exemplary device structure of TFT according to a second exemplary embodiment of the invention, having a top-gate and top-contact structure.

FIG. 15 is a schematic view of an exemplary TFT according to the second exemplary embodiment of the invention having a top-gate and top-contact device structure. TFT 10 has a structure formed on substrate 12, and this structure includes active layer 14 formed on the surface of substrate 12, source electrode 16 and drain electrode 18 formed on active layer 14 with a space therebetween, and gate insulating layer 20 and gate electrode 22 formed thereon in this order.

(Substrate)

Substrate 12 (support) is formed from a material having dimension stability, solvent resistance, processability, heat resistance or the like, as well as an insulating property at least on the surface thereof on which TFT 10 is to be formed. Further, when TFT 10 is used in an organic EL display or the like as a final product, substrate 12 is formed from a material that suppresses permeation of moisture or oxygen. When light emission or display is carried out by transmitting light from the side of substrate 12, it is formed from a material that transmits light.

Suitable substrates that satisfy the above requirements include inorganic materials such as glass or yttria-stabilized-zirconia (YSZ). Glass is preferably alkali-free in order to suppress the amount of elution of ions. When soda lime glass is used for the substrate, a barrier coating of silica or the like is preferably formed thereon.

When there is no need to take out light from the substrate side, the substrate may be selected from metal substrates such as stainless steel, Fe, Al, Ni, Co, Cu or an alloy thereof, or from a semiconductor substrate such as Si. An insulating film may be formed on the substrate in order to secure an electric insulation property. When a metal is used for the substrate, it can be produced at low cost, and a substrate having a high degree of strength and a high degree of barrier property with respect to moisture or oxygen in the air can be obtained even with a reduced thickness.

The shape, structure or size of the substrate is not particularly limited, and may be selected as appropriate according to purposes. Typically, the substrate is preferably in the form of a plate in view of ease of handling the same or formation of TFT 10 thereon. The substrate may have a monolayer structure or a laminated structure. Further, the substrate may be formed from a single member or multiple members.

(Active Layer)

On substrate 12, active layer 14 is formed by using an IGZO-based oxide material as described in the first exemplary embodiment as a structural material. This IGZO-based oxide material is represented by a composition formula of $In_{2-x}Ga_xZnO_{4-\delta}$, and is formed from a single phase of IGZO having a crystal structure of $YbFe_2O_4$. In the composition formula, the ranges of x and δ are $0.75 < x < 1.10$ and $0 < \delta \leq 1.29161 \times \exp(-x/0.11802) + 0.00153$, respectively.

The value of resistivity of the active layer is in the range of from $1 \times 10^2 \Omega \cdot cm$ to $1 \times 10^9 \Omega \cdot cm$. When the TFT has an active layer having a value of resistivity within this range, the TFT exhibits favorable electrical characteristics. The value of resistivity is preferably in the range of from $1 \times 10^4 \Omega \cdot cm$ to $1 \times 10^5 \Omega \cdot cm$, since the Vgs-Id curve rises at around 0 V.

In the above composition formula, the range of x is preferably $0.80 \leq x < 1.05$ in view of reliability. As mentioned in the first exemplary embodiment, this range corresponds to the solid-solution range of Ga when a bulk body is produced in a solid-phase reaction method, rather than a film formation method or a crystallization method described later in this section concerning the second exemplary embodiment. Therefore, there are cases in which the IGZO-based oxide material forms a single phase of IGZO even when the range of x is not $0.80 \leq x < 1.05$ or $0.75 \leq x < 1.10$. Accordingly, in the second exemplary embodiment, any range of x is satisfactory as long as a single phase is formed. However, since the solid-solution range of Ga or the like is typically broader in a method of producing a thin film, as compared with the case of a method of producing a bulk body in a solid-phase reaction method, formation of a single phase of IGZO from an IGZO-based oxide material is highly ensured even when a thin film is formed, when the range of x is $0.75 \leq x < 1.10$ at which Ga forms a solid solution in a bulk body as mentioned above.

Active layer 14 is formed by cooling a thin film material including In, Ga and Zn, which has been formed on substrate 12 and heated to a crystallization temperature thereof. The cooling is conducted at an average rate of temperature decrease of from 50° C./hr to 500° C./hr in the range of from the crystallization temperature to 300° C.

More specifically, active layer 14 is produced through a film formation process in which an amorphous IGZO film including In, Ga and Zn is formed on substrate 12, and a crystallization process in which the IGZO film is annealed at a crystallization temperature at which the IGZO film crystallizes in an oxygen-containing atmosphere, and then cooled.

In the film formation process, the IGZO film is preferably formed by a gas-phase film formation method using a polycrystalline sintered body of an amorphous oxide semiconductor including In, Ga and Zn as a target. Among the methods of gas-phase film formation, a sputtering method and a pulse laser deposition (PLD) method are preferred, and a sputtering method is particularly preferred in view of suitability for mass production.

The IGZO film formed in the above method is an amorphous material represented by a composition formula of $In_{2-x}Ga_xZnO_{4-\delta}$. In this composition formula, the range of δ is not particularly specified while the range of x is $0.75 < x < 1.10$. This is because the value of δ can be controlled in the subsequent process.

The above crystallization process can be conducted by a simple method, for example, by placing substrate 12 on which the amorphous IGZO film is formed in a furnace and annealing the same at a predetermined crystallization temperature. However, when the IGZO film needs to be heated to a temperature not lower than that substrate 12 can endure, a method of conducting crystallization in which heat rays are used for heating (annealing) is preferred. Examples of the heat treatment using heat rays include laser annealing in which the IGZO film is crystallized by annealing the same by scanning with laser beams used as heat rays; and flash lamp annealing in which a xenon flash lamp or the like is used as heat rays.

Laser annealing is a treatment in which heating is conducted by scanning the object with high-energy heat rays. According to this method, crystallization can be carried out at high efficiency, and the level of energy that reaches substrate 12 can be controlled by changing the laser irradiation conditions such as scanning speed or laser power. Accordingly, this method is suitable when substrate 12 has a low degree of heat resistance, since the laser irradiation conditions can be controlled in order to conform to the degree of heat resistance of substrate 12 so that the substrate temperature is not increased to a level higher than the temperature the substrate can endure.

The laser light source used for laser annealing is not particularly limited, and examples thereof include pulse-oscillating lasers such as excimer laser. Among these, short-wavelength pulse laser beams such as excimer laser beams are preferred since a great amount of energy is absorbed at the surface of the film, and the energy that reaches substrate 12 can be readily controlled.

Further, when the IGZO film itself does not absorb light of the wavelength of the laser light source, it is possible to heat only the IGZO film while maintaining the substrate temperature to a range not higher than that the substrate can endure, by providing a heat absorption layer.

Figure 16:
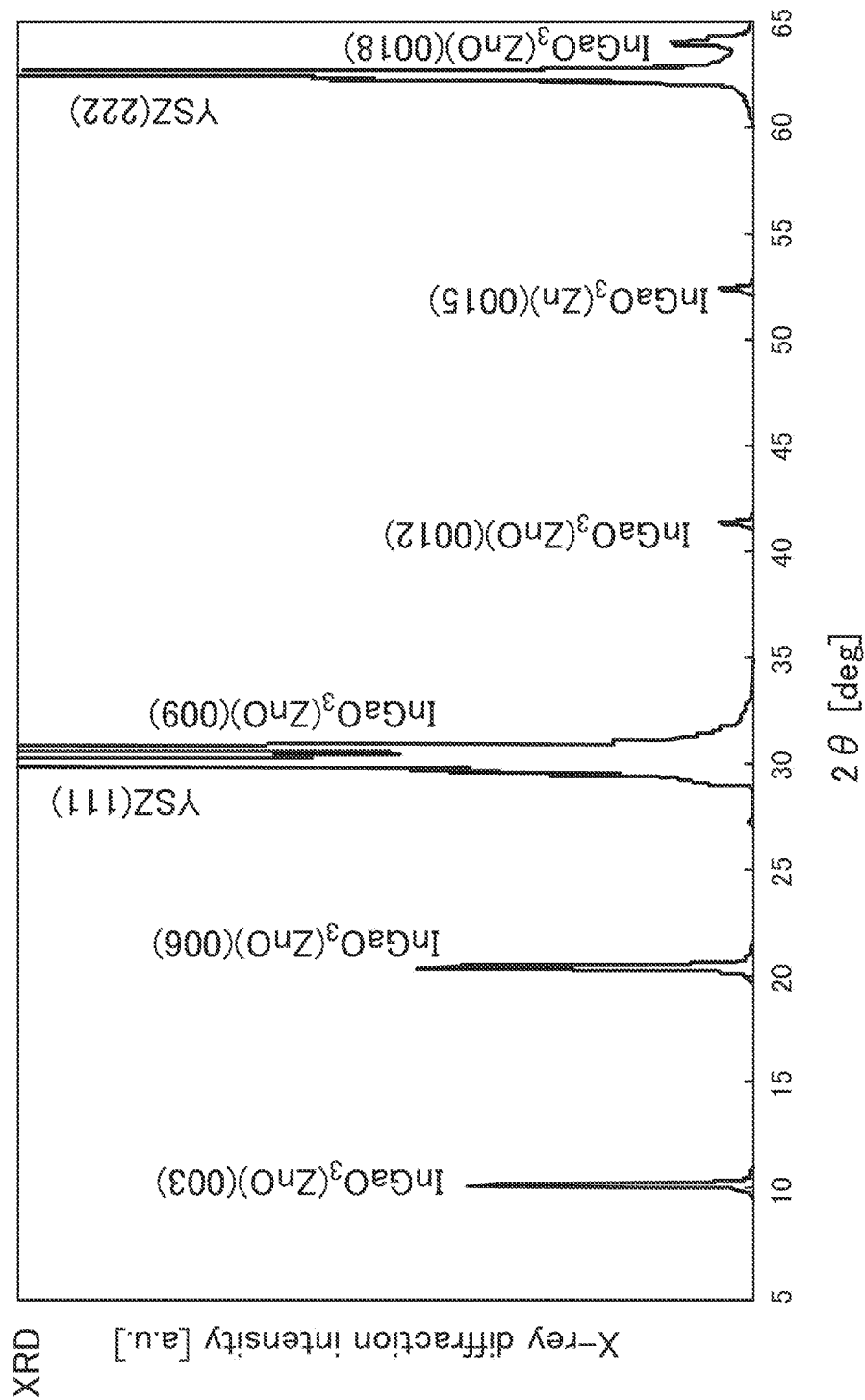
FIG. 16 shows the X-ray diffraction pattern of a single-crystal IGZO film produced by a reactive solid-phase epitaxial method (measurement conditions: $2\theta=30.0840°$, the axis is adjusted by fixing at IGZO(009))

In the crystallization process, it is also possible to form not only a polycrystalline IGZO film but also a single-crystalline IGZO film, for example, by a reactive solid-phase epitaxial method using a YSZ substrate (see FIG. 16).

Figure 17:
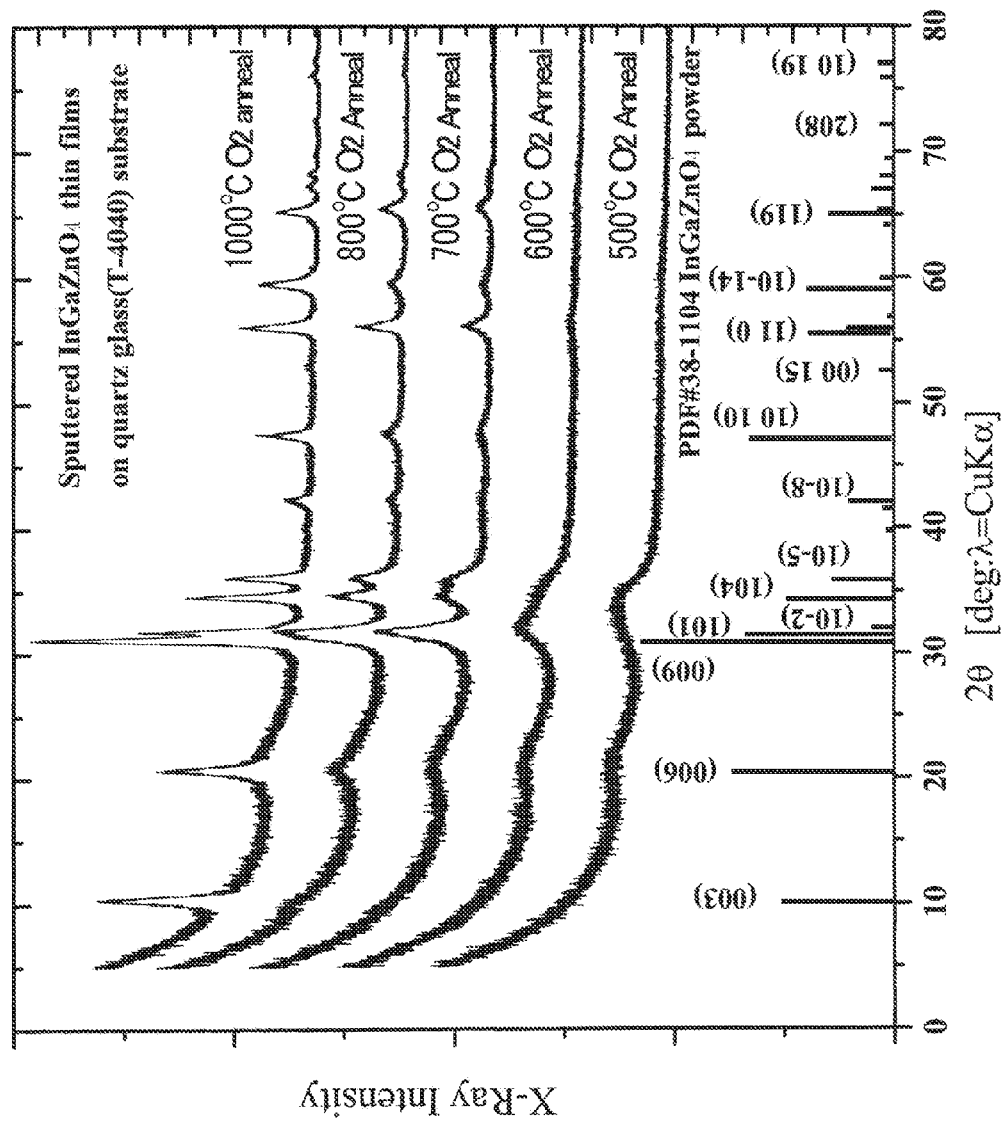
FIG. 17 shows the X-ray diffraction patterns of the IGZO films formed at different crystallization temperatures.

The crystallization temperature of the IGZO film is preferably 700° C. or higher but 1400° C. or lower. This is because the IGZO phase may start to decompose when the temperature is higher than 1400° C. FIG. 17 shows the X-ray diffraction patterns of an IGZO film at different crystallization temperatures. The reason why the crystallization temperature is 700° C. or higher is that the IGZO film is amorphous at a temperature of up to 600° C., but exists as a single phase of IGZO at a temperature of 700° C. or higher, as shown in FIG. 17.

The annealing atmosphere and the average rate of temperature decrease of the IGZO film are not explained in this section, since the conditions (A) and (C) described in the first exemplary embodiment also applies to this exemplary embodiment. However, when post-annealing (described later) is carried out after the crystallization, there is no need to consider the annealing atmosphere of the IGZO film or the average rate of temperature decrease during the crystallization. In particular, the aforementioned heat treatment using heat rays is a method of carrying out rapid heating. Therefore, this method is accompanied by "quenching" during the step of temperature decrease in the crystallization process. Accordingly, it is not possible to carry out "slowly cooling" and therefore an amount of oxygen vacancy δ tends to be increased. In this case, the level of an amount of oxygen vacancy δ can be lowered by conducting post-annealing in an oxygen-containing atmosphere.

After the formation of IGZO film, patterning is carried out in the shape of active layer 14. The patterning of IGZO film can be carried out by a photolithography method and an etching method. Specifically, a resist mask is formed in a patterned manner by a photolithography method to a portion at which the IGZO film formed on substrate 12 remains as active layer 14, and active layer 14 is formed by performing etching of the exposed portion of IGZO film with a mixed solution of hydrochloric acid, nitric acid and dilute sulfuric acid, or a mixed solution of phosphoric acid, nitric acid and acetic acid (Al etching solution, manufactured by Kanto Chemical). In particular, the exposed portion of IGZO film can be removed in a short time by using an aqueous solution including phosphoric acid, nitric acid and acetic acid.

In this section, active layer 14 is explained on the premise that TFT 10 has a top-gate and top-contact structure. When TFT 10 has a top-gate structure, active layer 14 is directly formed on substrate 12. Therefore, as compared with the bottom-gate structure, diffusion of heat to the gate electrode or the gate insulating layer can be suppressed, and the heating of the IGZO film during the crystallization process can be carried out with high reliability, thereby improving the crystallinity of the IGZO film. In particular, when TFT 10 has a top-gate and top-contact structure, diffusion of heat can be further suppressed since the source/drain electrodes are not positioned between active layer 14 and substrate 12.

(Source/Drain Electrodes)

After the formation of active layer 14, source electrode 16 and drain electrode 18 are formed.

First, a conductive film that forms the source/drain electrodes is formed on the surface of active layer 14. The conductive layer is formed so as to cover active layer 14 from a metal having conductivity that can be used as electrodes and wirings, and can be processed in a patterned manner by performing etching. Specific examples of the material for the conductive film include metals such as Al, Mo, Cr, Ta, Ti, Au and Ag, alloys such as Al—Nd and APC, metal oxide conductive films such as tin oxide, zinc oxide, indium oxide, indium tin oxide (ITO) and indium zinc oxide (IZO), organic conductive compounds such as polyaniline, polythiophene and polypyrrole, and a mixture of these materials.

The method of forming a conductive film is not particularly limited, and the formation of a conductive film can be carried out as appropriate according to the suitability to the material. Examples of the method include wet methods such as a printing method and a coating method, physical methods such as a vacuum deposition method, a sputtering method and an ion plating method, and chemical methods such as a CVD method and a plasma CVD method. For example, when ITO is selected as the material of source electrode 16 and drain electrode 18, the conductive film can be formed by a direct-current or high-frequency sputtering method, a vacuum deposition method, an ion plating method or the like. Further, when an organic conductive compound is used for the material of source electrode 16 and drain electrode 18, the conductive film can be formed by a wet film formation method.

The thickness of the conductive film (source/drain electrodes) may vary depending on the type of the raw material for the final product, but the total thickness of the conductive film that forms the source/drain electrodes and the wirings connected thereto is preferably from 10 nm to 1000 μm in view of film formation properties, ease of patterning by performing etching, conductivity (lowered resistivity), or the like.

(Gate Insulating Layer)

Gate insulating layer 20 is formed so as to cover active layer 14, source electrode 16 and drain electrode 18.

Gate insulating layer 20 may be an insulating film that includes an insulator such as $SiO_2$, $SiN_x$, $SiON$, $Al_2O_3$, $Y_2O_3$, $Ta_2O_5$ or $HfO_2$, or two or more of these compounds. A polymeric insulator such as polyimide is also applicable to the formation of gate insulating layer 20.

While gate insulating layer 20 needs to have a thickness that is enough to suppress the leak current and improve the voltage tolerability, increase in driving voltage may be caused if the gate insulating layer 20 is too thick. Although it depends on the type of the raw material for gate insulating layer 20, the thickness thereof is preferably from 50 nm to 1000 nm when an inorganic insulator is used, and is preferably from 0.2 μm to 5 μm when a polymeric insulator is used.

Gate insulating layer 20 is formed on the substrate by a method appropriately selected in view of the suitability for the material, from wet methods such as a printing method and a coating method, physical methods such as a vacuum deposition method, a sputtering method and an ion plating method, chemical methods such as a CVD method and a plasma CVD method, and the like. As necessary, gate insulating layer 20 may be patterned in a desired shape by a photolithography method.

(Gate Electrode)

Subsequently, gate electrode 22 is formed on gate insulating layer 20 so that gate electrode 22 is positioned on the side of gate insulating layer 20 opposite to active layer 14.

Specific examples of the suitable material for gate electrode 22 include metals such as Al, Mo, Cr, Ta, Ti, Au and Ag, alloys such as Al—Nd and APC, metal oxide conductive films such as tin oxide, zinc oxide, indium oxide, indium tin oxide (ITO) and indium zinc oxide (IZO), organic conductive compounds such as polyaniline, polythiophene and polypyrrole, and a mixture of these materials.

Gate electrode 22 is formed by a method appropriately selected in view of the suitability for the material, from wet methods such as a printing method and a coating method, physical methods such as a vacuum deposition method, a sputtering method and an ion plating method, chemical methods such as a CVD method and a plasma CVD method, and the like. The thickness of gate electrode 22 is preferably from 10 nm to 1000 nm. After forming gate electrode 22, it is patterned to a desired shape by a photolithography method. At this time, it is preferred to pattern gate electrode 22 and gate wirings at the same time.

<Variations>

In the above sections, the first and second exemplary embodiments of the invention are explained. However, the invention is not limited to these exemplary embodiments.

For example, the maximum annealing temperature Tmax, which is one of the conditions for conducting the main-annealing, is not particularly limited to the range of from 1200° C. to 1400° C. if the synthesis is conducted by a method other than the solid-phase reaction method as described in the first exemplary embodiment. For example, when a low-temperature synthesis method such as a sol-gel method or a coprecipitation method is employed, the range of maximum annealing temperature Tmax may be set to a lower level than that required in the solid-phase reaction method.

Further, the IGZO-based oxide material according to the first and second exemplary embodiments of the invention is produced by employing a technique of "slowly cooling" in a cooling step during the main-annealing. However, this technique of "slowly cooling" may not be employed in the cooling step during heating if the value of δ in the composition formula of IGZO-based oxide material ($In_{2-x}Ga_xZnO_{4-\delta}$), which is obtained by heating the same at certain conditions, is controlled to $0<\delta<1.29161\times exp(-x/0.11802)+0.00153$, by further subjecting the IGZO-based oxide material to post-annealing under an oxygen-containing atmosphere.

This technique of post-annealing is particularly effective when, for example, the IGZO-based oxide material with oxygen deficit amount δ of not less than $1.29161\times exp(-x/0.11802)+0.00153$ is a conductor, in order to change the IGZO-based oxide material to a semiconductor by controlling the value of δ to the range of $0<\delta<1.29161\times exp(-x/0.11802)+0.00153$. Moreover, this technique is effective also in the case in which the IGZO-based oxide material is a semiconductor with δ in the range of $0<\delta<1.29161\times exp(-x/0.11802)+0.00153$, in order to change the value of resistivity of the IGZO-based oxide material to a desired value by changing the value of δ to a different value within the range of $0<\delta<1.29161\times exp(-x/0.11802)+0.00153$.

Further, in the second exemplary embodiment, a method of forming an amorphous IGZO film on substrate 12 and then crystallizing the IGZO film is explained. However, the crystallization of the IGZO film may be conducted during the process of film formation. In this case, the aforementioned technique of "slowly cooling" is employed in the process of crystallization during the film formation.

EXAMPLES

In the following, the TFT and the method of producing the TFT according to the invention are described with reference to the examples. However, the invention is not limited to these examples. In the following Examples 1 to 4, the IGZO-based oxide materials used in the TFTs are described, prior to explaining the TFT and the method of producing the TFT according to the invention.

Example 1

1. Preparation of Raw Materials

As the raw materials for the IGZO-based oxide material according to Example 1 of the invention, an oxide powder of $In_2O_3$ (manufactured by Kojundo Chemical Lab. Co., Ltd., purity: 99.99%), an oxide powder of $Ga_2O_3$ (manufactured by Kojundo Chemical Lab. Co., Ltd., purity: 99.99%), and an oxide powder of ZnO (manufactured by Kojundo Chemical Lab. Co., Ltd., purity: 99.99%) were prepared.

2. Measurement and Mixing of Raw Material Powders

These oxide powders were measured using an electronic balance such that the molar ratio of In:Ga:Zn is 2−x:x:1 ($0.5 \leq x \leq 1.2$). For example, when the molar ratio of In:Ga:Zn is 1:1:1 (x=1), the mass of $In_2O_3$ is 30.0000 g, the mass of $Ga_2O_3$ is 20.2430 g, and the mass of ZnO is 17.5758 g.

These oxide powders were placed in a polyethylene wide-month bottle together with 100 ml of ethyl alcohol and 150 alumina balls having a diameter of 10 mm. This wide-mouth bottle is sealed so that the liquid was not spilled out, and the oxide powders were uniformly mixed by a wet method by rotating the wide-mouth bottle at 120 to 130 rpm for 12 hours using a desk-top pot mill rotating table.

3. Drying and Shaping of Powder Mixture

The alumina balls were taken out from the slurry of powder mixture obtained by mixing the same by a wet-method, and ethyl alcohol was removed therefrom using a rotary evaporator. The obtained powder mixture was dried at 100° C. for 12 hours and roughly crumbled in a mortar, and was then shaped into pellets having a square shape of 6 mm² and a thickness of 2 mm, by a uniaxial shaping method at a shaping pressure of 100 MPa.

4. Pre-Annealing and Main-Annealing of Powder Mixture

A Pt sheet was placed in an alumina sagger (SSA-S, trade name, manufactured by Nikkato Corporation), and the shaped product obtained by a uniaxial shaping method was placed on the Pt sheet. The alumina sagger on which the shaped product was placed was placed in a high-temperature furnace (FD41) and the shaped product was subjected to pre-annealing under an atmosphere by increasing the temperature at a rate of 500° C./hr, maintaining the maximum annealing temperature at 1100° C. for 2 hours, and then slowly cooling at a rate of 100° C./hr. After the pre-annealing, the pre-anneled body was pulverized in an agate mortar, and the obtained powder was again shaped into pellets by a uniaxial shaping method at a shaping pressure of 100 MPa.

Subsequently, the pre-sintered body shaped in the form of pellets was subjected to main-annealing at a maximum annealing temperature Tmax of about 1350° C. Other conditions for the main-annealing were the same as that of the pre-annealing.

The aforementioned processes (1. preparation of raw materials, 2. measurement and mixing of raw material powders, 3. drying and shaping of powder mixture and 4. pre-annealing and main-annealing) were repeated while changing the input molar ratio x of Ga in the raw materials, as shown in the following Table 2. In Table 2, sample numbers are given to the samples as prepared when the value of input molar ratio x of Ga in the raw material is given as a predetermined value.

TABLE 2

|  | Molar Ratio x when In:Ga:Zn = 2−x:x:1 |
| --- | --- |
| Sample 1 | 0.50 |
| Sample 2 | 0.60 |
| Sample 3 | 0.70 |
| Sample 4 | 0.75 |
| Sample 5 | 0.80 |
| Sample 6 | 0.85 |
| Sample 7 | 0.90 |
| Sample 8 | 0.95 |
| Sample 9 | 1.00 |
| Sample 10 | 1.05 |
| Sample 11 | 1.10 |
| Sample 12 | 1.20 |
| Sample 13 | 1.30 |
| Sample 14 | 1.40 |
| Sample 15 | 1.50 |

5. X-Ray Diffraction Measurement

The Pellets of Samples 1 to 15 Obtained by Performing the Main-Annealing were Pulverized in an agate mortar, respectively, and X-ray diffraction measurement of these samples was carried out using an X-ray diffraction measurement device (RINT-ULTIMA III, trade name, manufactured by Rigaku Corporation).

Specifically, the measurement was conducted with the above device using CuKα rays, at a tube voltage of 40 kV, a tube current of 40 mA, a scanning speed of 2.0 deg/min, a light-receiving slit of 0.15 mm, and a scanning range of from 2θ:5° to 135°. X-ray diffraction patterns of samples 1 to 15 were thus obtained.

Figure 5:
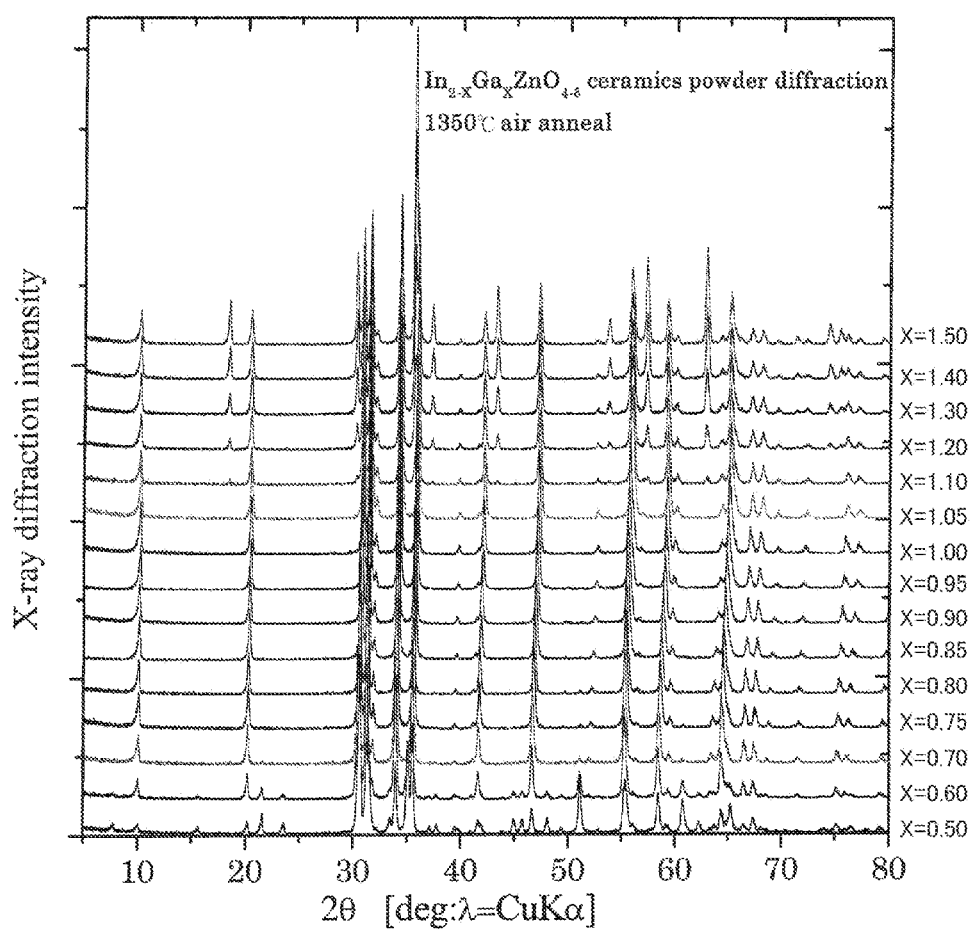
FIG. 5 shows the X-ray diffraction patterns of samples 1 to 15 after the main-annealing.

FIG. 5 shows the X-ray diffraction patterns of samples 1 to 15 after performing the main-annealing.

From the results shown in FIG. 5, it was confirmed that a single phase of $InGaZnO_4$ (JCPDS#38-1104) existed in samples 5 to 10 ($0.80 \leq x \leq 1.05$). In samples 3 and 4 ($0.70 \leq x \leq 0.75$), an $In_2O_3$ phase (JCPDS#06-0416) was precipitated in addition to an $InGaZnO_4$ phase (JCPDS#38-1104). In samples 1 and 2 ($0.50 \leq x \leq 0.60$), an $InGaZn_2O_5$ phase (JCPDS#40-0252) was further precipitated.

Moreover, in samples 11 to 15 ($0.80 \leq x \leq 1.05$), it was confirmed that a $ZnGa_2O_4$ phase (JCPDS#38-0416) was precipitated in addition to an $InGaZnO_4$ phase (JCPDS#38-1104). The above results are shown in Table 3.

TABLE 3

| Input Molar Ratio x of Ga | Precipitated Crystal Phase | JCPDS-No |
|---|---|---|
| $0.50 \leq x \leq 0.60$ | $InGaZnO_4$ | 38-1104 |
|  | $In_2O_3$ | 06-0416 |
|  | $InGaZn_2O_5$ | 40-0252 |
| $0.70 \leq x \leq 0.75$ | $InGaZnO_4$ | 38-1104 |
|  | $In_2O_3$ | 06-0416 |
| $0.80 \leq x \leq 1.05$ | $InGaZnO_4$ | 38-1104 |
| $1.10 \leq x \leq 1.50$ | $InGaZnO_4$ | 38-1104 |
|  | $ZnGa_2O_4$ | 38-0416 |

From the results described in Table 3, it is proved that the solid-solution range of Ga in $In_{2-x}Ga_xZnO_{4-\delta}$ is $0.80 \leq x \leq 1.05$. Further, although not shown in Table 3, there is a possibility that a single phase of $InGaZnO_4$ is obtained also in the ranges of $0.75 \leq x \leq 0.80$ and $1.05 \leq x \leq 1.10$. Accordingly, the solid-solution range of Ga is $0.75 \leq x \leq 1.10$, preferably $0.80 \leq x \leq 1.05$.

The solid-solution range shown above is narrower as compared with that of $0.66 \leq x \leq 1.06$ as described in Non-patent Document 2. This is because the oxide materials represented by $In_{2-x}Ga_xZnO_{4-\delta}$ obtained in the Examples are in thermal equilibrium at room temperature, as a result of decreasing the temperature in the main-annealing in a manner of "slowly cooling". Since the temperature decrease in the main-annealing is carried out in a manner of "quenching" in the method of Non-patent Document 2, the solid-solution range described therein is that under the high-temperature conditions. Since the solid-solution range is considered to be generally broader at a higher temperature, the solid-solution range described in Non-patent Document 2 is broader than that shown in the results of the Examples of the invention.

6. Calculation of Lattice Constant

In order to calculate the lattice constant of samples 1 to 15, the values are plotted according to the values of the Nelson-Riley function $\frac{1}{2}\{(\cos \theta)^2/\sin \theta + (\cos \theta)^2/\theta\}$ calculated from the angle 2θ at each diffraction peak in the X-diffraction pattern as the x axis and the values of the lattice constant at each index obtained from Bragg's diffraction condition as the y axis. Subsequently, the value of the y-intercept of the line obtained by a least-squares method was calculated as the true lattice constant.

More specifically, since $InGaZnO_4$ is a hexagonal crystal, the value of c-axis lattice constant was calculated prior to the calculation of the value of a-axis lattice constant. The true c-axis lattice constant was calculated using a Nelson-Riley function from the values of lattice constant obtained from the diffraction lines at (0012), (0015) and (0018).

The true a-axis lattice constant was calculated using a Nelson-Riley function from the values of lattice constant which were calculated by using the obtained true c-axis lattice constant at 2θ=80° to 135°.

Figure 6:
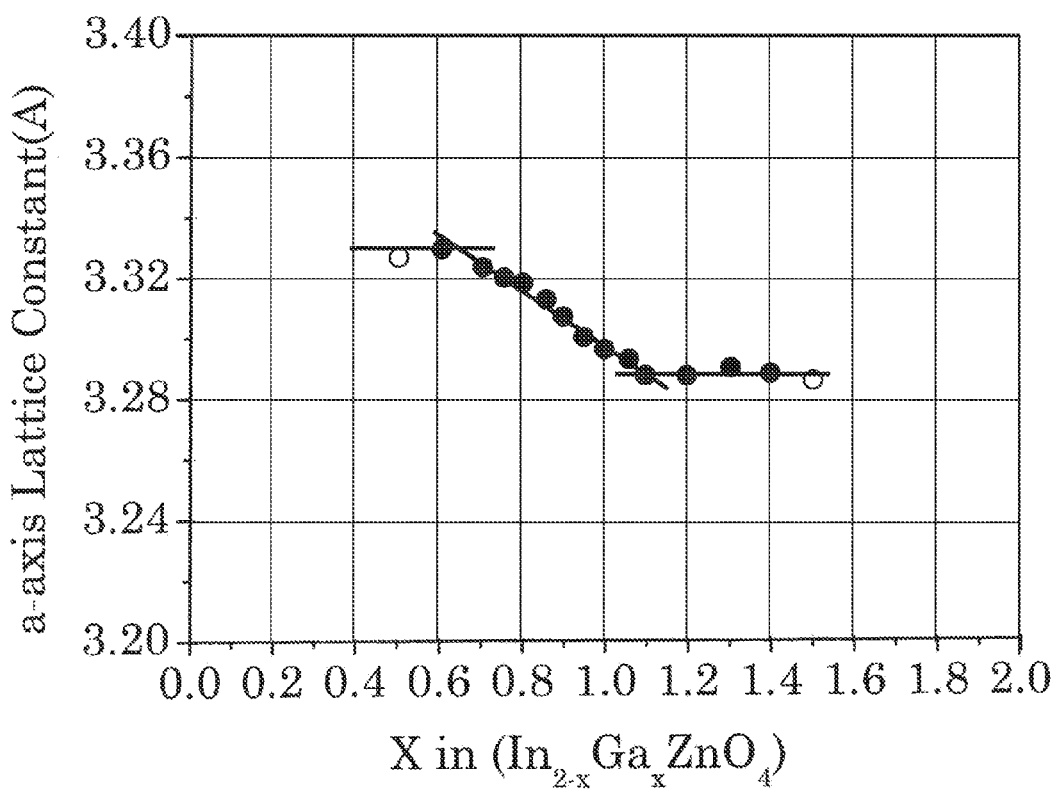
FIG. 6 shows the calculation results of a-axis lattice constant of samples 1 to 15.
Figure 7:
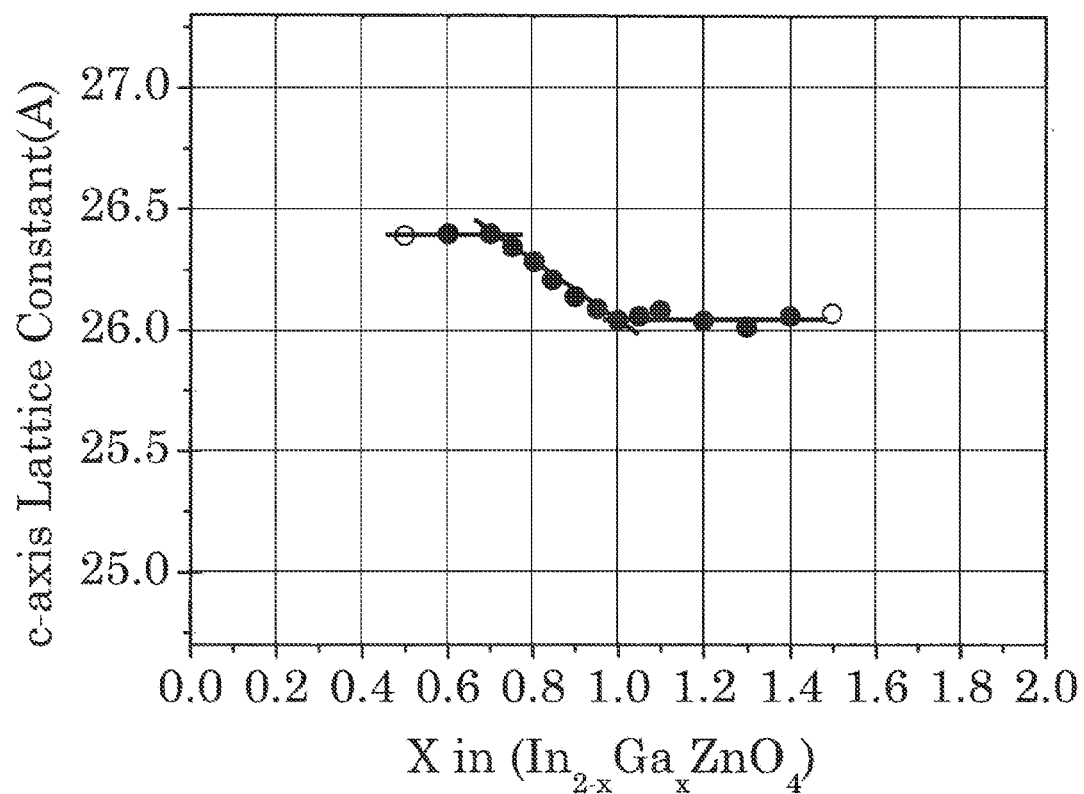
FIG. 7 shows the calculation results of c-axis lattice constant of samples 1 to 15.

FIG. 6 shows the calculation results of a-axis lattice constant of samples 1 to 15, and FIG. 7 shows the calculation results of c-axis lattice constant of samples 1 to 15.

As shown in FIG. 6 and FIG. 7, it was confirmed that the calculation results of sample 9 (x=1) were a=0.3298 nm and c=2.6028 nm, which were relatively closer to the values shown by a JCPDS card of $InGaZnO_4$ (No. 38-1104) of a=0.3295 nm and c=2.607 nm.

Further, it was proved that as the input molar ratio x of Ga was increased, the a-axis lattice constant and the c-axis lattice constant were both decreased. This result is considered to be a behavior within a predictable range according to Vegard's law that is derived from the fact that the ion radius of Ga is smaller than that of In.

7. Evaluation of Electrical Characteristics

An Au electrode was formed at a Van der Pauw position using the pellets having the size of 6 $mm^3$ of samples 1 to 15 after being subjected to main-annealing. Thereafter, the values of resistivity of samples 1 to 15 were measured using an AC Hall measurement device (RESITEST 8300, trade name, manufactured by Toyo Corporation), and the values of carrier concentration and mobility were calculated by carrying out a Hall measurement. These measurements were conducted under a nitrogen gas atmosphere.

Figure 8:
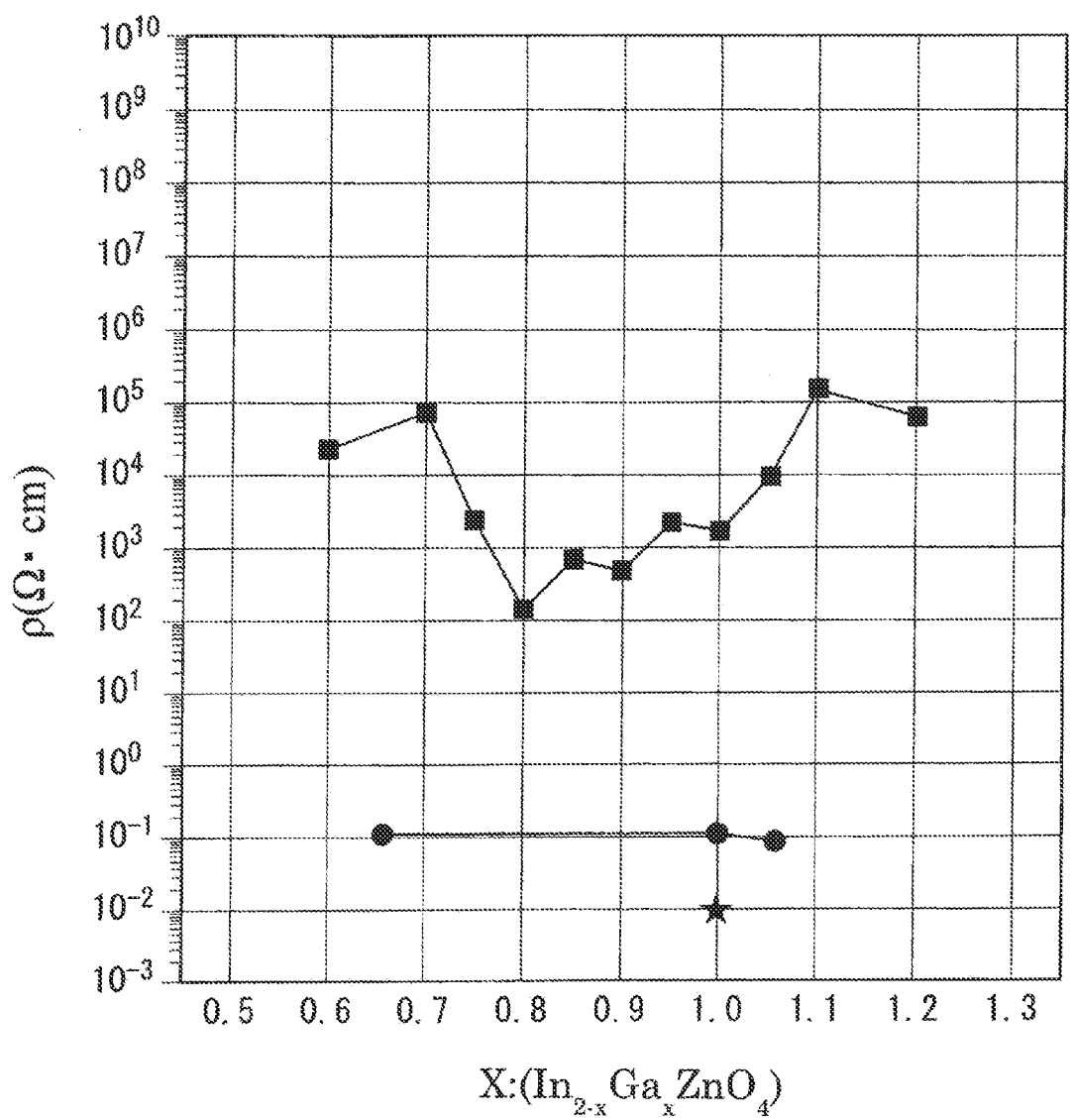
FIG. 8 shows the measurement results of value of resistivity of samples 1 to 15.

FIG. 8 shows the measurement results of the value of resistivity of samples 1 to 15 (square symbols in the graph). For the purpose of comparison, the values of resistivity described in Non-patent Document 2 (circle symbols in the graph) and the values of resistivity described in Japanese Journal of Applied Physics, 34 (1995) pp. L1550 to L1552 (star symbols in the graph) are also described.

From the measurement results shown in FIG. 8, it was confirmed that the value of resistivity was lower in the single-phase region in which the input molar ratio x of Ga is $0.80 \leq x \leq 1.05$, as compared with the case in which x was in other regions. It was also confirmed that the value of resistivity was increased as the value of x was increased.

Further, the values of resistivity obtained in the invention are more than three orders of magnitude higher than those described in Non-patent Document 2. This is because the production method described in Non-patent Document 2 includes a process of performing quenching from a high temperature, and the oxygen deficit amount δ is increased as a result of performing the quenching. In the method of Non-patent Document 2, the oxygen deficit amount δ is purposely increased by performing quenching with the vision of development as conductive materials. However, for example, for producing a semiconductor layer (active layer) of a TFT, the material preferably has a small oxygen deficit amount δ and a high degree of resistivity. Therefore, it can be said that changes in the electrical characteristics of an IGZO-based oxide material, which has a small oxygen deficit and is at thermal equilibrium at room temperature, were shown for the first time by the present examples.

Figure 9:
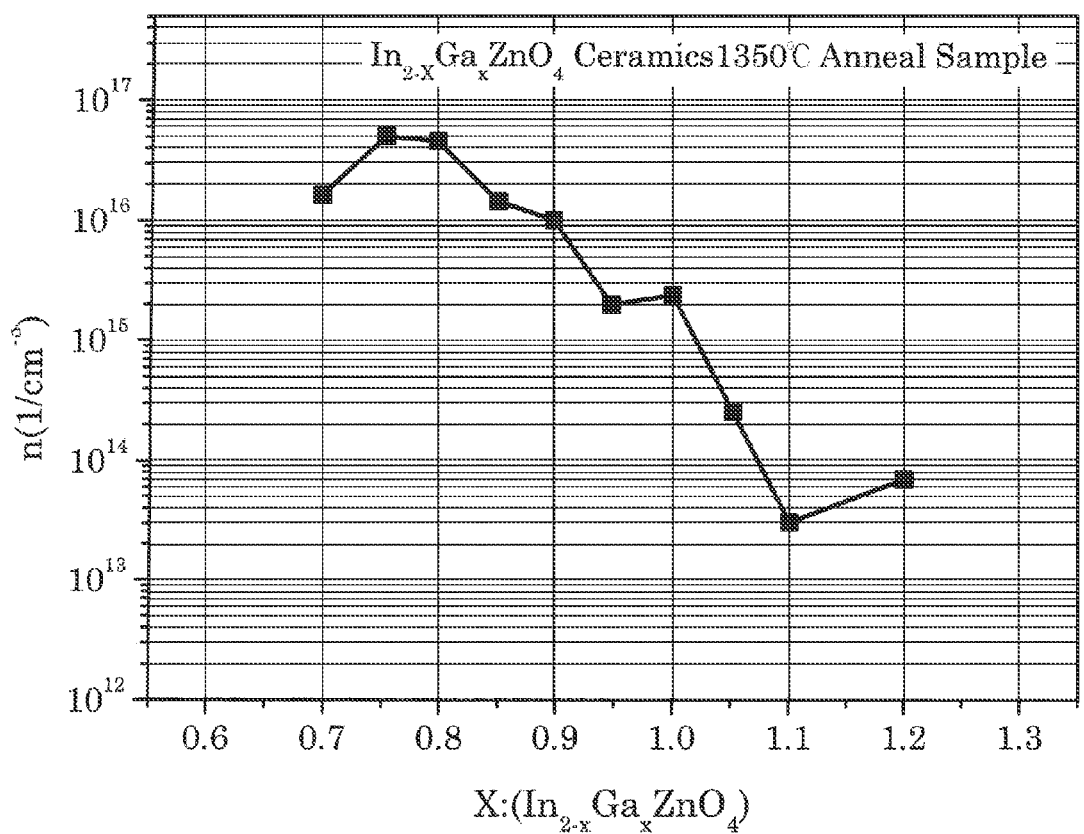
FIG. 9 shows the calculation results of carrier concentration of samples 1 to 15.
Figure 10:
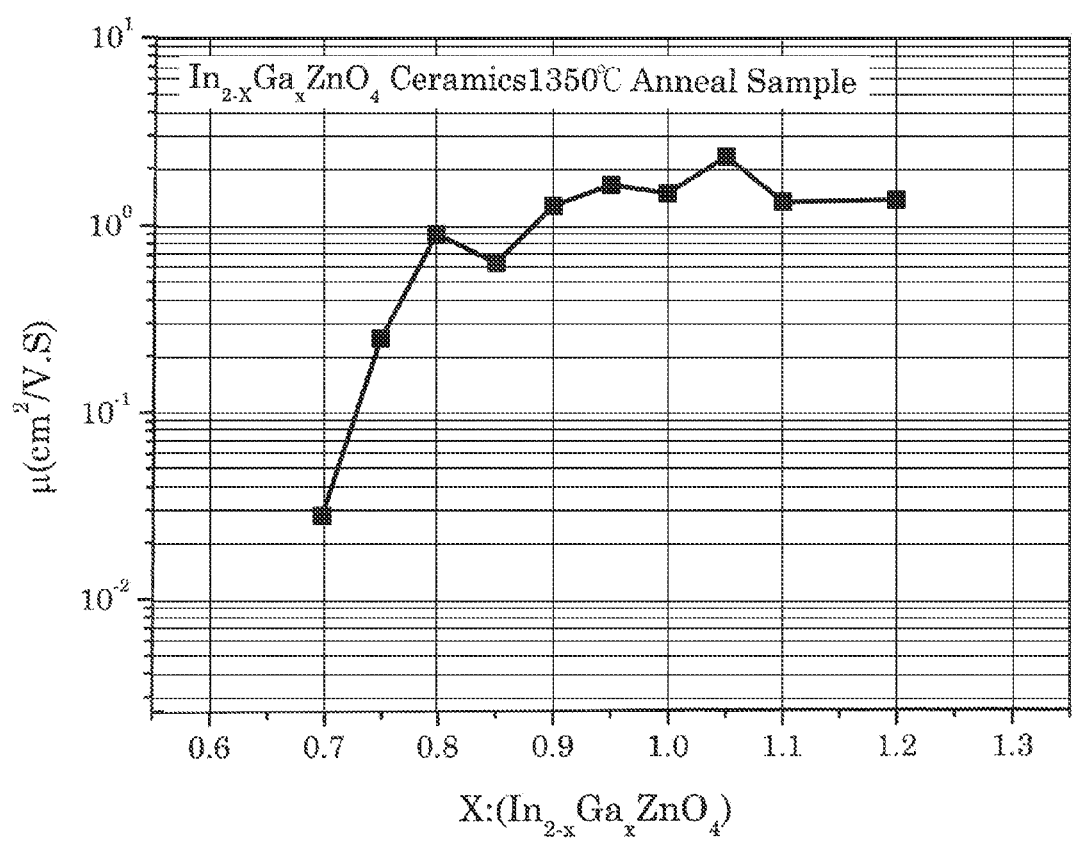
FIG. 10 shows the calculation results of mobility of samples 1 to 15.

FIG. 9 shows the calculation results of carrier concentration of samples 1 to 15, and FIG. 10 shows the calculation results of mobility of samples 1 to 15.

From the calculation results shown in FIG. 9 and FIG. 10, it was proved that when the input molar ratio x of Ga was increased in the single-phase region, the carrier concentration was decreased by three orders of magnitude, whereas the mobility did not significantly change. As a result, it was proved that the change in carrier concentration was a predominant factor of the change in the value of resistivity in the single-phase region.

Moreover, as shown in FIG. 9, the carrier concentrations of samples 1 to 15 were not higher than $10^{18}$ cm$^{-3}$, i.e., within a region of carrier concentration shown by a common type of semiconductor.

8. Evaluation of Oxygen Deficit Amount

The oxygen deficit amount δmax of $In_{2-x}Ga_xZnO_{4-\delta}$ at which the value of resistivity was $\rho \geq 10^2 \Omega\cdot cm$, which was suitable for an active layer of a TFT, was calculated. Specifically, the value of δmax was calculated based on a combination of the results of the measurement of temperature dependency of the value of resistivity, Hall measurement and thermogravimetric analysis, in a manner as shown below.

(1) Measurement of Temperature Dependency of Value of Resistivity

Figure 11:
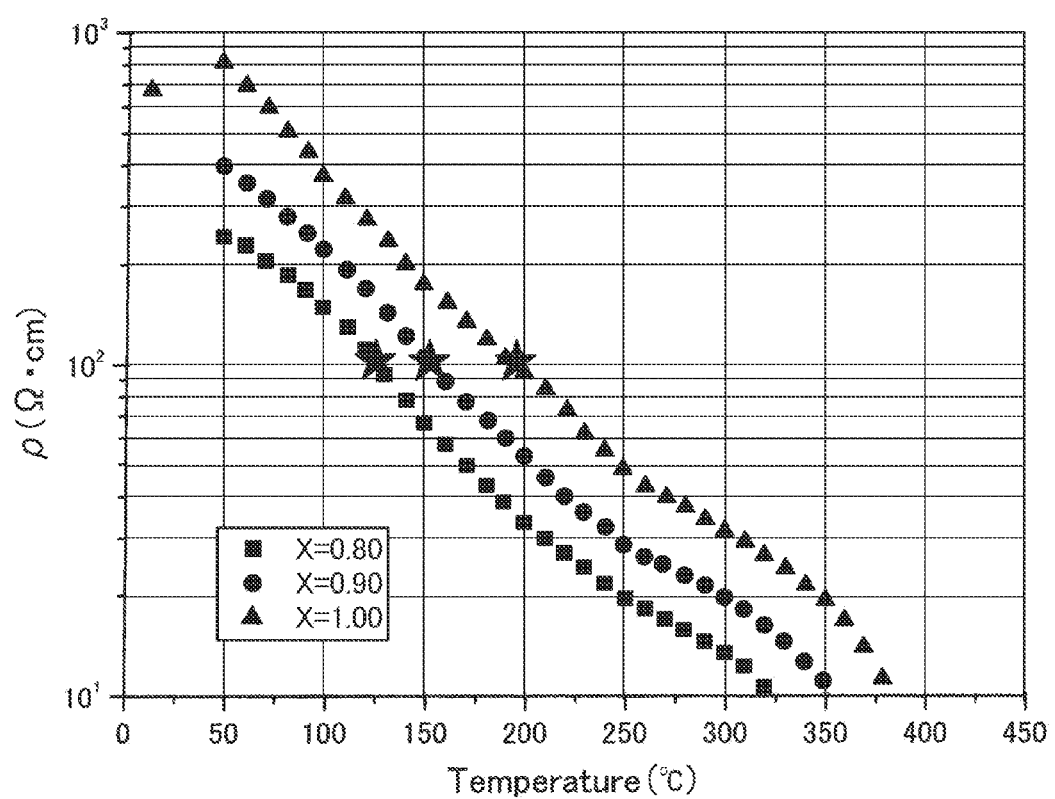
FIG. 11 shows the measurement results of temperature dependency of resistivity of samples 5, 7 and 9.

The temperature dependency of the value of resistivity of sample 5 (x=0.80), sample 7 (x=0.90) and sample 9 (x=1.00) as shown in Table 2 were measured in an argon atmosphere. FIG. 11 shows the measurement results of temperature dependency of the value of resistivity of samples 5, 7 and 9. Temperature $T_\rho$ at which the value of resistivity p is in the range of $\rho \geq 10^2 \Omega\cdot cm$, which is suitable for an active layer of a TFT, was calculated from these measurement results (see the star symbols in the graph). As a result, the $T_\rho$ at x=0.80 was 125.5° C., the $T_\rho$ at x=0.90 was 153.4° C. and the $T_\rho$ at x=1.00 was 194.0° C.

(2) Hall Measurement

Figure 12:
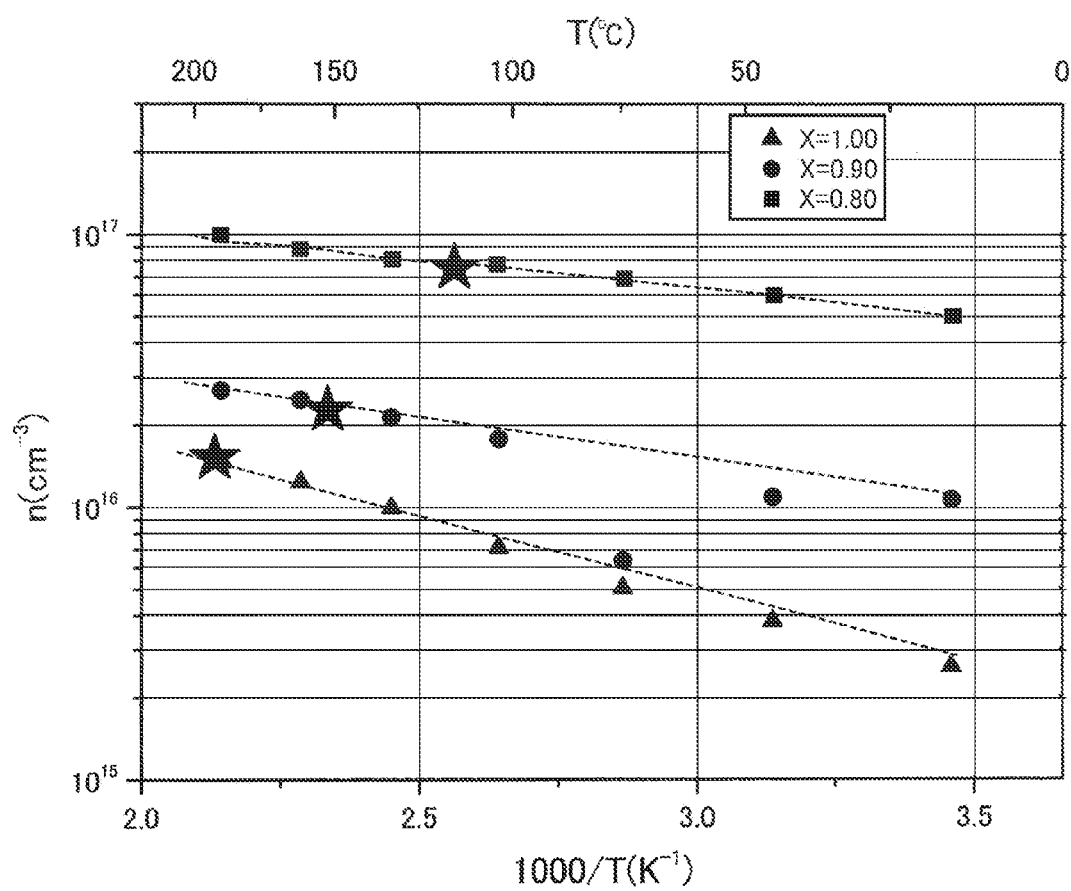
FIG. 12 shows the results of Hall measurement of samples 5, 7 and 9 conducted at different temperatures.

The Hall measurement of sample 5 (x=0.80), sample 7 (x=0.90) and sample 9 (x=1.00) was conducted in an argon atmosphere while changing the temperature. FIG. 12 shows the result of Hall measurement of samples 5, 7 and 9 as measured at different temperatures. From these measurement results, the value of carrier concentration $In_{T_\rho}$ was calculated (see the star symbols in the graph). As a result, the $n_{T_\rho}$ where x=0.80 was $8.20 \times 10^{16}$ (cm$^{-3}$), the $n_{T_\rho}$ where x=0.90 was $2.09 \times 10^{16}$ (cm$^{-3}$) and the $n_{T_\rho}$ where x=1.00 was $1.57 \times 10^{16}$ (cm$^{-3}$).

Subsequently, the difference Δn in the carrier concentration $n_{T_\rho}$ at a temperature $T_\rho$ and the career concentration $n_{RT}$ at room temperature $T_{RT}$ (25° C.), expressed by $\Delta n = n_{T_\rho} - n_{RT}$, was calculated. The value of Δn where x=0.80 was $3.28 \times 10^{16}$ (cm$^{-3}$), the value of Δn where x=0.90 was $1.28 \times 10^{16}$ (cm$^{-3}$), and the value of Δn where x=1.00 was $1.33 \times 10^{16}$ (cm$^{-3}$).

The difference Δn indicates the amount of carriers generated while changing the temperature of $In_{2-x}Ga_xZnO_{4-\delta}$ from room temperature $T_{RT}$ to $T_\rho$, which corresponds to the amount of carriers generated by the relative amount of change of oxygen deficit Δδ as described later. In the present examples, all of the increase or decrease in carrier concentration are assumed to be due to the oxygen deficit.

(3) Thermogravimetric Analysis

The thermogravimetric analysis of sample 5 (x=0.80), sample 7 (x=0.90) and sample 9 (x=1.00) was conducted using a measurement device (PYRIS 1 TGA, trade name, manufactured by PerkinElmer Inc.) Specifically, the measurement was conducted under an argon atmosphere at a flow rate of 40 cc/mm, by increasing the temperature up to 400° C. at a rate of 15° C./min.

Figure 13:
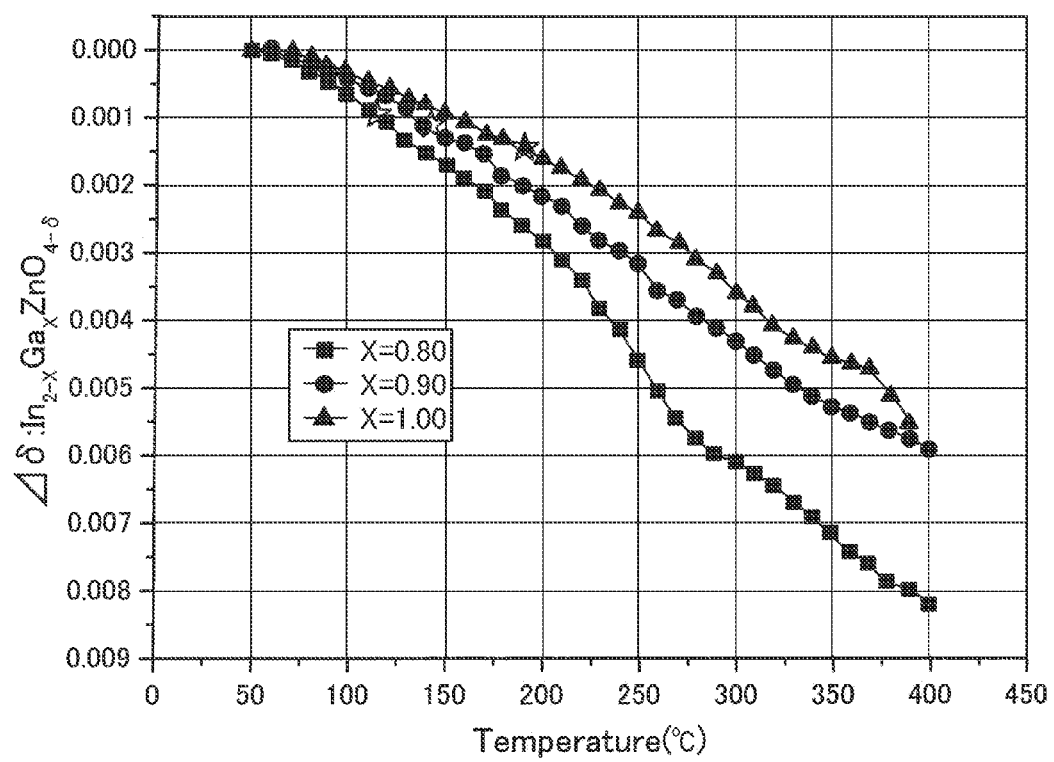
FIG. 13 shows the results of thermogravimetric measurement of samples 5, 7 and 9.

FIG. 13 shows the measurement results of thermogravimetric analysis of samples 5, 7 and 9. The value Δδ along the longitudinal axis indicates the relative amount of change of oxygen deficit per mole of IGZO, which is converted from the weight to the oxygen deficit amount based on the assumption that all changes observed in the thermogravimetric analysis is caused by oxygen deficit, and represents a relative amount of change between the oxygen deficit amount as measured at room temperature and the oxygen deficit amount as measured after heating the sample to a predetermined temperature.

From the measurement results obtained in the above process, the relative amount of change Δδ of each sample at $T_\rho$ was calculated (star symbols shown in the drawing). As a result, the Δδ of sample 5 (x=0.80) was 0.00121, the Δδ of sample 7 (x=0.90) was 0.00132, and the Δδ of sample 9 (x=1.00) was 0.00153.

(4) Calculation of Oxygen Deficit Amount δmax

The value of oxygen deficit amount δmax can be calculated by adding the oxygen deficit amount $\delta_{RT}$ of samples 5, 7 and 9 that already existed at room temperature $T_{RT}$ (before annealing) and the relative amount of change of oxygen deficit Δδ after annealing the samples to a temperature of $T_\rho$ (refer to the following expression (1)).

$$\delta max = \delta_{RT} + \Delta\delta \qquad (1)$$

Since there is a correlation between the oxygen deficit amount and the carrier concentration, the following expressions (2) and (3) are derived when the conversion constant for converting the carrier concentration to the oxygen deficit amount is given as α.

$$n_{RT} \times \alpha = \delta_{RT} \qquad (2)$$

$$\Delta n \times \alpha = \Delta\delta \qquad (3)$$

In order to calculate the value of $\delta_{RT}$, conversion constant α of each sample was obtained using expression (3). Then, the obtained α was substituted into expression (2) together with $n_{RT}$, thereby calculating $\delta_{RT}$.

As a result of the above calculation, the $\delta_{RT}$ of sample 5 (x=0.80) was 0.00179, the $\delta_{RT}$ of sample 7 (x=0.90) was 0.00084, and the $\delta_{RT}$ of sample 9 (x=1.00) was 0.00027. As shown in FIG. 8, the values of resistivity p of the IGZOs having an oxygen deficit amount of $\delta_{RT}$ were $10^2 \Omega\cdot cm$ or higher. Therefore, these oxygen deficit amounts $\delta_{RT}$ can be considered to be suitable for an active layer of a TFT.

Finally, the obtained Δδ and the calculated $\delta_{RT}$ were substituted into expression (1), thereby calculating δmax.

As a result of the above calculation, the δmax of sample 5 (x=0.80) was 0.00300, the max of sample 7 (x=0.90) was 0.00216, and the δmax of sample 9 (x=1.00) was 0.00180.

Figure 14:
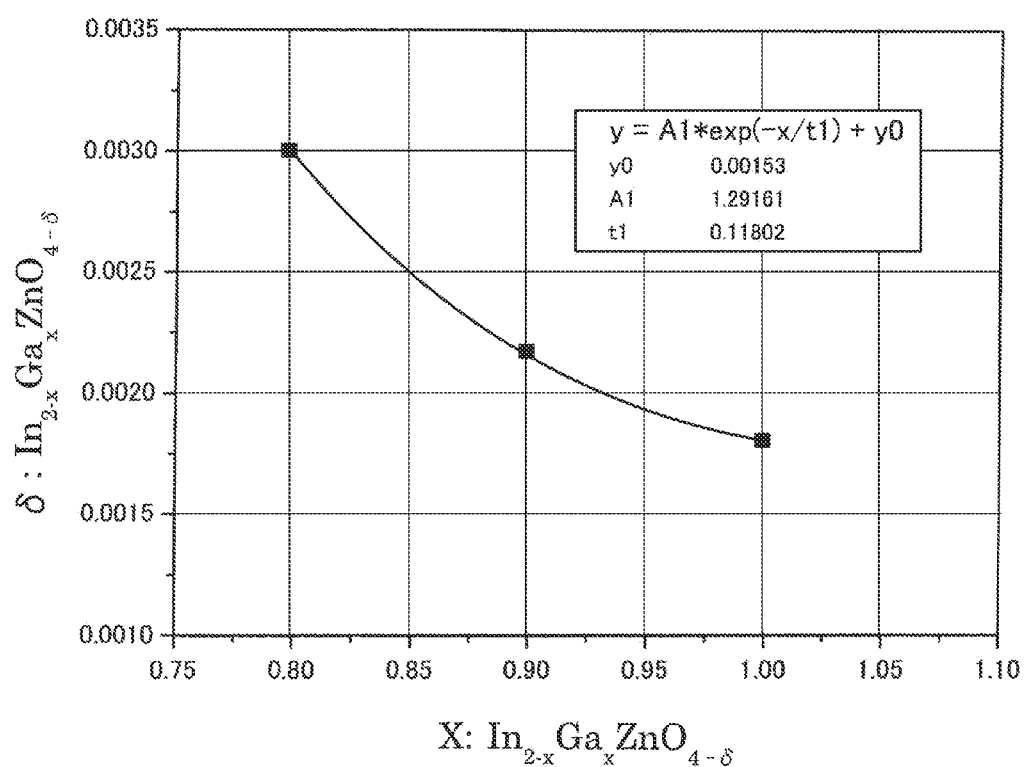
FIG. 14 shows the correlative relationship of input molar ratio x of Ga and $\delta$max of IGZO.

FIG. 14 shows the correlative relationship of input molar ratio x of Ga and δmax of IGZO.

The relational expression of molar ratio x and δmax was obtained from three data points shown in FIG. 14. Specifically, fitting of these three data points was conducted using a relational expression: y=A1×exp(−x/t1)+Y0, and constants A1, t1 and Y0 were obtained.

As a result, the following relational expression (4) was obtained.

$$\delta max = 1.29161 \times \exp(-x/0.11802) + 0.00153 \qquad (4)$$

From the above results, it was derived that in the single-phase region of $In_{2-x}Ga_xZnO_{4-\delta}$, the range of $\delta \leq \delta max = 1.29161 \times \exp(-x/0.11802) + 0.00153$ was δ in which the value of resistivity p was $10^2 \Omega\cdot cm$ or higher, considering the fact that the carrier concentration can be more suppressed when the oxygen deficit amount is smaller.

Example 2

In Example 2, a sample in which the input molar ratio x of Ga was 1.00 and a sample in which the input molar ratio x of Ga was 0.80 were produced in accordance with the method and conditions similar to that of Example 1. However, the average rate of temperature decrease during the main-annealing was 500° C./h in Example 2, instead of 100° C./h in Example 1.

Subsequently, X-ray diffraction measurement, calculation of lattice constant and evaluation of electrical characteristics of these two samples (x=1.00, 0.80) were conducted in accordance with the method and conditions similar to that of Example 1.

As a result of the X-ray diffraction measurement, it was confirmed that a single phase of $InGaZnO_4$ (JCPDS#38-1104) was obtained both in these two samples (x=1.00, 0.80).

As a result of the calculation of lattice constant, the lattice constants of the sample (x=1.00) were a=0.3294 nm and c=2.6036 nm, which were relatively closer to the lattice constants of a=0.3295 nm and c=2.6070 nm indicated by a JCPDS card of $InGaZnO_4$ (No. 38-1104). Further, the lattice constants of the sample (x=0.80) were a=0.3320 nm and c=2.6272 nm. From these results, it was proved that as the input molar ratio x of Ga having a small ionic radius was increased, the lattice constants on the a-axis and the c-axis were also decreased, as was the case with Example 1.

As a result of measuring the value of resistivity of each sample, the value of resistivity p of the sample (x=1.00) was $9.83 \times 10^2 \Omega \cdot cm$, and the value of resistivity p of the sample (x=0.80) was $1.12 \times 10^2 \Omega \cdot cm$. From these results, it was proved that as the input molar ratio x of Ga was increased, the value of resistivity was also increased, as was the case with Example 1.

Then, Hall measurement of each sample was conducted to calculate the mobility and carrier concentration thereof. As a result, the mobility ($\mu$) and the carrier concentration (n) of the sample (x=1.00) were $\mu=0.83$ cm$^2$/V.S and n=$3.50 \times 10^{15}$ cm$^{-3}$, respectively; and the mobility ($\mu$) and the carrier concentration (n) of the sample (x=0.80) were $\mu=0.74$ cm$^2$/V.S and n=$6.21 \times 10^{16}$ cm$^{-3}$, respectively. In view of the above, it was proved that the carrier concentration was the dominant factor for causing changes in the value of resistivity, as was the case with Example 1.

Example 3

In Example 3, a sample in which the input molar ratio x of Ga was 1.00 and a sample in which the input molar ratio x of Ga was 0.80 were produced in accordance with the method and conditions similar to that of Example 1. However, the average rate of temperature decrease during the main-annealing was 50° C./h in Example 3, instead of 100° C./h in Example 1.

Subsequently, X-ray diffraction measurement, calculation of lattice constant and evaluation of electrical characteristics of these two samples (x=1.00, 0.80) were conducted in accordance with the method and conditions similar to that of Example 1.

As a result of the X-ray diffraction measurement, it was confirmed that a single phase of $InGaZnO_4$ (JCPDS#38-1104) was obtained in these two samples (x=1.00, 0.80).

As a result of the calculation of lattice constant, the lattice constants of the sample (x=1.00) were a=0.3295 nm and c=2.6038 nm, which were relatively closer to the lattice constants of a=0.3295 nm and c=2.6070 nm indicated by a JCPDS card of $InGaZnO_4$ (No. 38-1104). Further, the lattice constants of the sample (x=0.80) were a=0.3321 nm and c=2.6275 nm. From these results, it was proved that as the input molar ratio x of Ga having a small ionic radius was increased, the lattice constants on the a-axis and the c-axis were also decreased, as was the case with Example 1 and Example 2.

As a result of measuring the value of resistivity of each sample, the value of resistivity p of the sample (x=1.00) was $5.21 \times 10^3 \Omega \cdot cm$, and the value of resistivity $\rho$ of the sample (x=0.80) was $3.54 \times 10^2 \Omega \cdot cm$. From these results, it was proved that as the input molar ratio x of Ga was increased, the value of resistivity was also increased, as was the case with Example 1.

Then, Hall measurement of each sample was conducted to calculate the mobility and carrier concentration thereof. As a result, the mobility ($\mu$) and the carrier concentration (n) of the sample (x=1.00) were $\mu=0.67$ cm$^2$/V.S and n=$9.81 \times 10^{14}$ cm$^{-3}$, respectively; and the mobility ($\mu$) and the carrier concentration (n) of the sample (x=0.80) were $\mu=0.78$ cm$^2$/V.S and n=$5.23 \times 10^{16}$ cm$^{-3}$, respectively. In view of the above, it was proved that the carrier concentration was the dominant factor for causing changes in the value of resistivity, as was the case with Example 1 and Example 2.

Example 4

In Example 4, a sample in which the input molar ratio x of Ga was 1.00 was prepared by a method and conditions similar to that of Example 1. However, Example 4 employed furnace cooling, which was capable of rapid cooling by turning off the power of an electric furnace to allow natural cooling from the maximum annealing temperature (Tmax=1350° C.), instead of "slowly cooling" employed in Example 1 for temperature decrease during the main-annealing.

Further, the sample was subjected to post-annealing by increasing the temperature up to 500° C. in an atmosphere of oxygen gas 100% at a rate of temperature increase of 500° C./h, maintaining this temperature for 2 hours, and then cooling the same at an average rate of temperature decrease of 100° C./h.

X-ray measurement, calculation of lattice constant and evaluation of electrical characteristics of the sample was conducted by the same method and conditions to that of Example 1, both before and after the post-annealing.

As a result of the X-ray diffraction measurement, it was confirmed that a single phase of $InGaZnO_4$ (JCPDS#38-1104) was obtained in the sample in both cases of before and after the post-annealing.

The calculation result of the lattice constant was that the lattice constants of the sample before the post-annealing were a=0.3291 nm and c=2.6040 nm, and the lattice constants of the sample after the post-annealing were a=0.3291 nm and c=2.6040 nm.

As a result, it was proved that the lattice constants of the sample in both cases of before and after the post-annealing were relatively similar to a=0.3321 nm and c=2.6275 nm shown by a JCPDS card of $InGaZnO_4$ (No. 38-1104).

The result of measuring the value of resistivity of the sample before the post-annealing was $\rho=3.21 \times 10^3 \Omega \cdot cm$ before the post-annealing, whereas the value of resistivity of each sample after the post-annealing was $\rho=5.31 \times 10^3 \Omega \cdot cm$ after the post-annealing. Therefore, it was confirmed that the value of resistivity was increased by performing post-annealing. As a result, it was confirmed that the value of resistivity of an IGZO oxide material could be increased up to a value at which the material could operate as an active layer of a TFT, or the like, by performing post-annealing in an oxidizing atmosphere that contains oxygen.

Example 5

In Example 5, four TFTs having a top-gate and top-contact structure were produced. An IGZO single-crystalline film or an IGZO polycrystalline film was used as an active layer for the TFTs. The active layer was formed by the method as described below. Moreover, the average rate of temperature decrease for the annealing of each active layer was 100° C./h.

1. Production of TFT Using Active Layer Formed from IGZO Single-Crystalline Film Two TFTs having an active layer formed from an IGZO single-crystalline film were produced as the TFTs of Example 5.

Specifically, on a single-crystalline YSZ (111) substrate that was flattened at the atomic level by performing a step treatment, a ZnO thin film having a thickness of 2 nm was formed by sputtering at a substrate temperature of 550° C., and an amorphous IGZO film having a thickness of 100 nm was deposited thereon by performing sputtering of IGZO at room temperature. The input molar ratio x of Ga was x=1.00.

The thus obtained IGZO film was capped with a YSZ (111) single-crystalline substrate in order to prevent the evaporation of ZnO. After subjecting to a heat-diffusion treatment in the air at 1400° C. for 30 minutes using an electric furnace, the IGZO film was cooled to room temperature at a rate of 100° C./h. The IGZO film (IGZO-based oxide material) after the heat treatment had a single-crystalline structure of a single phase of IGZO.

Subsequently, patterning of the IGZO film was conducted by a photolithography method and an etching method, and then source/drain electrodes were formed from ITO. The formation of ITO was performed by a lift-off process into a pattern of L/W=100 μm/1000 μm or L/W=5 μm/5 μm. Thereafter, a gate insulation film was formed from $SiO_x$ having a thickness of 200 nm, and a gate electrode was formed from ITO. The L and W described above refer to the channel length and the channel width, respectively.

2. Production of TFT Using Active Layer Formed from IGZO Polycrystalline Film

Further, two TFTs having an active layer formed from an IGZO polycrystalline film were produced as the TFTs of Example 5. Specifically, IGZO was deposited on a quartz substrate (T-4040) by performing sputtering at room temperature to form an amorphous IGZO film having a thickness of 100 nm. The input molar ratio x of Ga was x=1.00.

The thus obtained IGZO film was subjected to a heat treatment in an oxygen-containing atmosphere at 100° C. for 1 hour using an electric furnace, and was then cooled to room temperature at a rate of 100° C./h. The IGZO film (IGZO-based oxide material) after the heat treatment had a polycrystalline structure of a single phase of IGZO.

Subsequently, patterning of the IGZO film was conducted by a photolithography method and an etching method, and then source/drain electrodes were formed from ITO by a lift-off process into a pattern of L/W=100 μm/1000 μm or L/W=5 μm/5 μm. Thereafter, a gate insulation film was formed from $SiO_x$ having a thickness of 200 nm, and a gate electrode was formed from ITO.

2. Evaluation of Transistor Performances

The transistor performances of the four TFTs as prepared above were evaluated by using a semiconductor parameter analyzer (AGILENT 4155C, trade name, manufactured by Agilent Technologies). The measurement was performed in a dry air. The obtained evaluation results are shown in Table 4. In Table 4, sample numbers (1) to (4) are given to the four TFTs as prepared.

TABLE 4

|   | L/W (μm/μm) | X-ray | $\rho$ ($\Omega \cdot$ cm) | $\mu$ ($cm^2/V \cdot S$) | Log ($I_{on}/I_{off}$) |
|---|---|---|---|---|---|
| (1) | 100/1000 | Single Crystal | $4.23 \times 10^4$ | 12.2 | 7.1 |
| (2) | 5/5 | Single Crystal | $5.12 \times 10^4$ | 11.3 | 7.3 |
| (3) | 100/1000 | Poly Crystal | $1.50 \times 10^3$ | 6.3 | 6.2 |
| (4) | 5/5 | Poly Crystal | $2.34 \times 10^3$ | 5.8 | 5.8 |

As shown in Table 4, it was confirmed that the TFTs prepared by the method of Example 5 were able to operate. Further, it was confirmed that the TFTs prepared by the method of Example 5 exhibited favorable electrical characteristics from the fact that the active layer of the TFTs exhibited a value of resistivity of $10^2 \Omega \cdot$cm or higher.

Example 6

In Example 6, four TFTs were prepared by the same method and conditions as that of Example 5, except that the annealing of the active layer was conducted at an average rate of temperature decrease of 500° C./h. The input molar ratio x of Ga was x=1.00 in Example 6.

In a similar manner to Example 5, the transistor performances of the TFTs as prepared above were evaluated. The obtained evaluation results are shown in Table 5. In Table 5, sample numbers (5) to (8) are given to the four TFTs as prepared.

TABLE 5

|   | L/W (μm/μm) | X-ray | $\rho$ ($\Omega \cdot$ cm) | $\mu$ ($cm^2/V \cdot S$) | Log ($I_{on}/I_{off}$) |
|---|---|---|---|---|---|
| (5) | 100/1000 | Single Crystal | $2.21 \times 10^4$ | 13.6 | 6.8 |
| (6) | 5/5 | Single Crystal | $3.89 \times 10^4$ | 12.1 | 6.7 |
| (7) | 100/1000 | Poly Crystal | $8.82 \times 10^2$ | 7.8 | 5.8 |
| (8) | 5/5 | Poly Crystal | $1.12 \times 10^3$ | 8.2 | 5.4 |

As shown in Table 5, it was confirmed that the TFTs prepared by the method of Example 6 were able to operate. Further, by comparing the results of Table 4 and Table 5, it was confirmed that as the average rate of temperature decease is lowered, the electrical resistivity ρ was increased, the mobility μ was decreased, and the on-off ratio (Log($I_{on}/I_{off}$)) was increased.

Accordingly, it was proved that the lower the average rate of temperature decrease was, the more favorable the transistor performances (higher on/off ratio) were.

Example 7

In Example 7, four TFTs were prepared at an average rate of temperature decrease of 50° C./h during performing the annealing of the active layer. Other methods and conditions were the same as that of Example 5. The input molar ratio x of Ga was x=1.00 in Example 7.

Similar to Example 5, the transistor performances of the TFTs as prepared above were evaluated. The obtained evaluation results are shown in Table 6. In Table 6, sample numbers (9) to (12) are given to the four TFTs as prepared.

TABLE 6

| | L/W (μm/μm) | X-ray | ρ (Ω·cm) | μ (cm²/V·S) | Log ($I_{on}/I_{off}$) |
|---|---|---|---|---|---|
| (9) | 100/1000 | Single Crystal | $6.23 \times 10^4$ | 10.2 | 7.8 |
| (10) | 5/5 | Single Crystal | $7.12 \times 10^4$ | 10.4 | 7.1 |
| (11) | 100/1000 | Poly Crystal | $4.23 \times 10^3$ | 4.2 | 6.8 |
| (12) | 5/5 | Poly Crystal | $6.21 \times 10^3$ | 4.9 | 6.4 |

As shown in Table 6, it was confirmed that the TFTs prepared by the method of Example 7 were able to operate. Further, by comparing the results shown in Table 4, Table 5 and Table 6, it was confirmed that as the average rate of temperature decrease was lowered, the electrical resistivity ρ was increased, the mobility μ was decreased, and the on/off ratio (Log($I_{on}/I_{off}$)) was increased.

Accordingly, it was proved that the lower the average rate of temperature decrease was, the more the more favorable the transistor performances (higher on/off ratio) were.

Example 8

In Example 8, four TFTs having a top-gate and top-contact structure, and four TFTs having a bottom-gate and top-contact structure were prepared, respectively. The active layer of these TFTs was prepared in the following manner. The active layer of each TFT was subjected to post-annealing after conducting the heat treatment (crystallization process).

1. Top-Gate and Top-Contact Structure: Single-Crystalline (Post-Annealed after Formation of Active Layer)

Two TFTs having a top-gate and top-contact structure were prepared as the TFTs of Example 8. Specifically, a ZnO thin film having a thickness of 2 nm was formed on a YSZ (111) single-crystalline substrate that was flattened at the atomic level by performing a step treatment, by performing sputtering at a substrate temperature of 550° C., and then depositing an amorphous IGZO film having a thickness of 100 nm by sputtering IGZO at room temperature.

The thus obtained film was capped with a YSZ (111) single-crystalline substrate in order to prevent the evaporation of ZnO, and after subjecting the same to a heat-diffusion treatment in the air, at 1400° C. for 30 minutes, using an electric furnace, the film was cooled to room temperature by furnace cooling.

Subsequently, patterning of the IGZO film was conducted by a photolithography method and an etching method. Then, post-annealing was conducted in an atmosphere of oxygen 100% by increasing the temperature up to 500° C. at rate of temperature increase of 500° C./h, maintaining this temperature for 2 hours, and then cooling at an average rate of temperature decrease of 100° C./h. Thereafter, source/drain electrodes were formed from ITO by a lift-off process into a pattern of L/W=100 μm/1000 μm or L/W=5 μm/5 μm. A gate insulation film was formed from $SiO_x$ to a thickness of 200 nm, and a gate electrode was formed from ITO.

2. Top-Gate and Top-Contact Structure: Single-Crystalline (Post-Annealed after Formation of Source/Drain Electrodes)

Two TFTs having a top-gate and top-contact structure were prepared as the TFTs of Example 8. Specifically, these TFTs were prepared by the same manner as the method 1 of Example 8, except that the post-annealing was conducted after the patterning of the source/drain electrodes.

3. Bottom-Gate and Top-Contact Structure: Polycrystalline (Post-Annealed after Formation of Active Layer)

Two TFTs having a bottom-gate and top-contact structure were prepared as the TFTs of Example 8. Specifically, on a quartz substrate, a gate electrode was formed from Mo and an insulating film was formed from $SiO_x$ to a thickness of 200 nm. An amorphous IGZO film was deposited to a thickness of 100 nm by performing sputtering of IGZO at room temperature. Thereafter, a polycrystalline IGZO film was formed by performing a heat treatment at 1000° C. for 30 minutes.

Subsequently, patterning of the IGZO film was conducted by a photolithography method and an etching method. Thereafter, post-annealing was conducted in an atmosphere of oxygen 100% by increasing the temperature up to 500° C. at rate of temperature increase of 500° C./h, maintaining this temperature for 2 hours, and then cooling at an average rate of temperature decrease of 100° C./h. Then, source/drain electrodes were formed from ITO by a lift-off process into a pattern of L/W=100 μm/1000 μm or L/W=5 μm/5 μm. Thereafter, a gate insulation film was formed from $SiO_x$ to a thickness of 200 nm, and a gate electrode was formed from ITO.

4. Bottom-Gate and Top-Contact Structure: Polycrystalline (Post-Annealed after Formation of Source/Drain Electrodes)

Two TFTs having a bottom-gate and top-contact structure were prepared as the TFTs of Example 8. Specifically, these TFTs were prepared in the same manner as the method 3 of Example 8, except that the post-annealing was performed after the patterning of the source/drain electrodes.

5. Evaluation of Transistor Performances

The transistor performances of these eight TFTs were evaluated in a manner similar to Example 5. The obtained results are shown in Table 7. In Table 7, sample numbers (13) to (20) are given to these eight TFTs.

TABLE 7

| Device Structure | Annealing before/after formation of electrodes | L/W (μm/μm) | X-ray | ρ (Ω·cm) | μ (cm²/V·S) | Log ($I_{on}/I_{off}$) |
|---|---|---|---|---|---|---|
| (13) Top | Before | 100/1000 | Single Crystal | $6.23 \times 10^4$ | 15.2 | 7.6 |
| (14) Top | Before | 5/5 | Single Crystal | $4.10 \times 10^4$ | 14.3 | 7.4 |
| (15) Top | After | 100/1000 | Single Crystal | $7.86 \times 10^3$ | 11.1 | 6.8 |
| (16) Top | After | 5/5 | Single Crystal | $8.90 \times 10^3$ | 10.8 | 6.9 |
| (17) Bottom | Before | 100/1000 | Poly Crystal | $2.13 \times 10^3$ | 5.3 | 6.1 |
| (18) Bottom | Before | 5/5 | Poly Crystal | $3.84 \times 10^3$ | 5.1 | 6.3 |
| (19) Bottom | After | 100/1000 | Poly Crystal | $7.12 \times 10^2$ | 9.3 | 5.7 |
| (20) Bottom | After | 5/5 | Poly Crystal | $5.98 \times 10^2$ | 8.7 | 5.8 |

As shown in Table 7, it was confirmed that the TFTs prepared by the method of the present Example were able to operate. Further, although it cannot be generally mentioned in view of different states of crystallization of the active layers, i.e., single-crystalline or polycrystalline, it was confirmed that the TFTs having a top-gate and top-contact structure exhibited a value of resistivity ρ being approximately 10 times higher than that of the TFTs having a bottom-gate and top-contact structure. Further, it was confirmed that the TFTs having a top-gate and top-contact structure exhibited a higher carrier mobility μ than that of the TFTs having a bottom-gate and top-contact structure. Moreover, it was confirmed that the TFTs having a top-gate and top-contact structure exhibited a higher on/off ratio ($Log(I_{on}/I_{off})$) than that of the TFTs having a bottom-gate and top-contact structure.

In view of the above, it was proved that the transistor performances obtained by producing a TFT having a top-gate and top-contact structure were more favorable (higher on/off ratio) as compared with the case of producing a TFT having a bottom-gate and top-contact structure.

Further, it was confirmed that the TFTs to which the post-annealing was conducted before the formation of the source/drain electrodes exhibited a value of resistivity ρ of being more than 10 times as high as that of the TFTs to which the post-annealing was conducted after the formation of the source/drain electrodes. Moreover, it was confirmed that the TFTs to which the post-annealing was conducted before the formation of the source/drain electrodes exhibited a higher carrier mobility μ than that of the TFTs to which the post-annealing was conducted after the formation of the source/drain electrodes. Additionally, it was confirmed that the TFTs to which the post-annealing was conducted before the formation of the source/drain electrodes exhibited a higher on/off ratio than that of the TFTs to which the post-annealing was conducted after the formation of the source/drain electrodes.

Concerning the oxygen deficit amount δ of the IGZO-based oxide material of the active layer, it was proved that the range of δ was $δ≦1.29161 \times exp(-x/0.11802)+0.00153$, as explained in Example 1, in view of the fact that the value of resistivity of the active layer was $10^2$ Ω·cm or higher.

The invention includes the following exemplary embodiments.

(1) A thin film transistor having an active layer, the active layer comprising an IGZO-based oxide material, the IGZO-based oxide material being represented by a composition formula of $In_{2-x}Ga_xZnO_{4-δ}$, where 0.75<x<1.10 and $0<δ≦1.29161 \times exp(-x/0.11802)+0.00153$, and being formed from a single phase of IGZO having a crystal structure of $YbFe_2O_4$.

(2) The thin film transistor according to (1), wherein the active layer has a value of resistivity of from $1 \times 10^2$ Ω·cm to $1 \times 10^9$ Ω·cm.

(3) The thin film transistor according to (1) or (2), wherein x in the composition formula satisfies 0.80≦x≦1.05.

(4) A method of producing the thin film transistor according to (1), wherein the active layer is produced by a process comprising cooling a thin film material comprising In, Ga and Zn, the thin film material having been formed on a substrate and heated to a crystallization temperature of the thin film material, from the crystallization temperature to 300° C. at an average rate of temperature decrease of from 50° C./hr to 500° C./hr.

(5) The method of producing the thin film transistor according to (4), wherein the thin film material is formed on the substrate by gas-phase film formation.

(6) The method of producing the thin film transistor according to (4), wherein the crystallization temperature is from 700° C. to 1400° C.

(7) The method of producing the thin film transistor according to (4), wherein the average rate of temperature decrease is from 100° C./hr to 200° C./hr.

(8) A method of producing the thin film transistor according to (1), the method comprising;

forming an active layer on a substrate, the active layer comprising an IGZO-based oxide material, the IGZO-based oxide material being represented by a composition formula of $In_{2-x}Ga_xZnO_{4-δ}$, where 0.75<x<1.10 and δ>0, and formed from a single phase of IGZO having a crystal structure of $YbFe_2O_4$; and controlling the value of δ to a range of $0<δ≦1.29161 \times exp(-x/0.11802)+0.00153$ by subjecting the active layer to post-annealing in an oxidizing atmosphere containing oxygen.

(9) The method of producing the thin film transistor according to (4), further comprising forming at least a gate insulating layer and a gate electrode on the active layer, and the thin film transistor having a top-gate device structure.

(10) The method of producing the thin film transistor according to (9), further comprising forming a source electrode and a drain electrode prior to the formation of the gate insulating layer and the gate electrode, and the thin film transistor having a top-contact device structure.

All publications, patent applications, and technical standards mentioned in this specification are herein incorporated by reference to the same extent as if each individual publication, patent application, or technical standard was specifically and individually indicated to be incorporated by reference.

What is claimed is:

1. A thin film transistor comprising an active layer, the active layer comprising an IGZO-based oxide material, the IGZO-based oxide material being represented by a composition formula of $In_{2-x}Ga_xZnO_{4-δ}$, where 0.75<x<1.10 and $0<δ≦1.29161 \times exp(-x/0.11802)+0.00153$, and being formed from a single phase of IGZO having a crystal structure of $YbFe_2O_4$, wherein the active layer has a value of resistivity of from $1×10^2 Ω·cm$ to $1×10^9 Ω·cm$.

2. The thin film transistor according to claim 1, wherein x in the composition formula satisfies $0.80 ≦ x ≦ 1.05$.

3. A method of producing the thin film transistor according to claim 1, wherein the active layer is produced by a process comprising:

forming a thin film material comprising In, Ga and Zn on a substrate;

heating the thin film material to a crystallization temperature of the thin film material; and cooling the thin film material from the crystallization temperature to 300° C. at an average rate of temperature decrease of from 50° C./hr to 500° C./hr.

4. The method of producing the thin film transistor according to claim 3, wherein the thin film material is formed on the substrate by gas-phase film formation.

5. The method of producing the thin film transistor according to claim 3, wherein the crystallization temperature is from 700° C. to 1400° C.

6. The method of producing the thin film transistor according to claim 3, wherein the average rate of temperature decrease is from 100° C./hr to 200° C./hr.

7. A method of producing the thin film transistor according to claim 1, the method comprising:

forming an active layer on a substrate, the active layer comprising an IGZO-based oxide material, the IGZO-based oxide material being represented by a composition formula of $In_{2-x}Ga_xZnO_{4-δ}$, where $0.75 < x < 1.10$ and $δ > 0$, and being formed from a single phase of IGZO having a crystal structure of $YbFe_2O_4$; and controlling the value of δ to a range of $0 < δ ≦ 1.29161 × exp(-x/0.11802) + 0.00153$ by subjecting the active layer to post-annealing in an oxidizing atmosphere containing oxygen.

8. The method of producing the thin film transistor according to claim 3, further comprising forming at least a gate insulating layer and a gate electrode on the active layer, and wherein the thin film transistor has a top-gate device structure.

9. The method of producing the thin film transistor according to claim 8, further comprising forming a source electrode and a drain electrode prior to the formation of the gate insulating layer and the gate electrode, and wherein the thin film transistor has a top-contact device structure.

* * * * *